United States Patent
Lee et al.

(10) Patent No.: US 12,094,405 B2
(45) Date of Patent: Sep. 17, 2024

(54) STACKED DISPLAY DRIVER INTEGRATED CIRCUIT AND DISPLAY DEVICE INCLUDING THE SAME

(71) Applicant: SAMSUNG ELECTRONICS CO., LTD., Suwon-si (KR)

(72) Inventors: Changju Lee, Suwon-si (KR); Kyoungmin Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 15 days.

(21) Appl. No.: 17/986,367

(22) Filed: Nov. 14, 2022

(65) Prior Publication Data

US 2023/0206830 A1 Jun. 29, 2023

(30) Foreign Application Priority Data

Dec. 23, 2021 (KR) .................. 10-2021-0185659

(51) Int. Cl.
| | |
|---|---|
| *G09G 3/3225* | (2016.01) |
| *G06F 3/041* | (2006.01) |
| *G06V 40/13* | (2022.01) |
| *G09G 3/20* | (2006.01) |
| *H01L 23/00* | (2006.01) |
| *H01L 23/522* | (2006.01) |
| *H01L 25/16* | (2023.01) |
| *H10K 59/12* | (2023.01) |

(52) U.S. Cl.
CPC ......... *G09G 3/3225* (2013.01); *G06F 3/0416* (2013.01); *G06V 40/13* (2022.01); *G09G 3/2096* (2013.01); *H01L 24/08* (2013.01); *H01L 25/167* (2013.01); *G09G 2300/0842* (2013.01); *G09G 2354/00* (2013.01); *G09G 2360/18* (2013.01); *H01L 2224/08145* (2013.01); *H10K 59/12* (2023.02)

(58) Field of Classification Search
USPC ........................................................ 345/204
See application file for complete search history.

(56) References Cited

U.S. PATENT DOCUMENTS

| | | | |
|---|---|---|---|
| 9,871,899 | B2 | 1/2018 | Kim |
| 10,839,756 | B2 | 11/2020 | Park et al. |
| 10,862,010 | B2 | 12/2020 | Bonar et al. |
| 10,923,023 | B1 | 2/2021 | Bibl et al. |

(Continued)

FOREIGN PATENT DOCUMENTS

| | | |
|---|---|---|
| KR | 10-2010-0029438 A | 3/2010 |
| KR | 10-1273337 B1 | 6/2013 |

*Primary Examiner* — Chineyere D Wills-Burns
(74) *Attorney, Agent, or Firm* — Muir Patent Law, PLLC

(57) ABSTRACT

A stacked display driver integrated circuit (DDIC) configured to drive a display panel of a display device includes a first circuit and a second circuit. The first circuit is formed by a low-end process according to a first design rule such that the first circuit has a first critical dimension. The second circuit is formed by a high-end process according to a second design rule smaller than the first design rule such that the second circuit has a second critical dimension smaller than the first critical dimension. The first circuit and the second circuit are stacked in a vertical direction. The size of the stacked DDIC may be reduced by stacking, in the vertical direction, the first circuit including analog circuits and the second circuit including digital circuits.

20 Claims, 21 Drawing Sheets

(56) References Cited

U.S. PATENT DOCUMENTS

| | | | |
|---|---|---|---|
| 2002/0011996 A1* | 1/2002 | Inoue | G09G 5/006 |
| | | | 345/204 |
| 2012/0038045 A1* | 2/2012 | Lee | H01L 23/3107 |
| | | | 257/737 |
| 2016/0013153 A1* | 1/2016 | Meyer | H01L 24/24 |
| | | | 257/737 |
| 2016/0253540 A1* | 9/2016 | Han | H04M 1/026 |
| | | | 382/124 |
| 2017/0061857 A1* | 3/2017 | Lee | H01L 25/0657 |
| 2017/0344787 A1* | 11/2017 | Cho | G06F 3/04166 |
| 2017/0358265 A1 | 12/2017 | Wang | |
| 2019/0206841 A1* | 7/2019 | Kim | H01L 25/0657 |
| 2020/0053874 A1* | 2/2020 | Eom | H05K 3/30 |
| 2020/0320930 A1* | 10/2020 | Toyotaka | H05B 33/14 |
| 2021/0183314 A1 | 6/2021 | Wacyk | |
| 2021/0405794 A1* | 12/2021 | Shepelev | G06F 3/0412 |
| 2022/0093671 A1* | 3/2022 | Sicard | H01L 27/14634 |
| 2022/0189389 A1* | 6/2022 | Lee | G09G 3/3208 |
| 2023/0419891 A1* | 12/2023 | Yamazaki | G09G 3/3266 |

* cited by examiner

STACKED DISPLAY DRIVER INTEGRATED CIRCUIT AND DISPLAY DEVICE INCLUDING THE SAME

CROSS-REFERENCE TO RELATED APPLICATION

This U.S. non-provisional application claims priority under 35 U.S.C. § 119 to Korean Patent Application No. 10-2021-0185659, filed on Dec. 23, 2021, in the Korean Intellectual Property Office (KIPO), the disclosure of which is incorporated by reference herein in its entirety.

BACKGROUND

1. Field

Example embodiments relate generally to semiconductor integrated circuits, and more particularly to a stacked display driver integrated circuit (DDIC), a display device including a stacked DDIC, and a method of manufacturing a stacked DDIC.

2. Description of the Related Art

Contemporary mobile devices may include a display device (e.g., an organic light emitting diode (OLED) display device) calling for an increased memory capacity for processing image data. Such mobile devices may consume significant power due to high speed driving, e.g., at a frame rate greater than or equal to 120 Hz.

SUMMARY

According to an embodiment, a stacked display driver integrated circuit (DDIC) configured to drive a display panel of a display device includes a first circuit and a second circuit. The first circuit is formed by a low-end process according to a first design rule such that the first circuit has a first critical dimension. The second circuit is formed by a high-end process according to a second design rule smaller than the first design rule such that the second circuit has a second critical dimension smaller than the first critical dimension. The first circuit and the second circuit are stacked in a vertical direction.

According to an embodiment, a display device includes a display panel including a plurality of pixels and a stacked display driver integrated circuit (DDIC) configured to drive the display panel. The stacked DDIC includes a first circuit formed by a low-end process according to a first design rule such that the first circuit has a first critical dimension and a second circuit formed by a high-end process according to a second design rule smaller than the first design rule such that the second circuit has a second critical dimension smaller than the first critical dimension. The first circuit and the second circuit are stacked in a vertical direction.

According to an embodiment, a method of manufacturing a stacked display driver integrated circuit (DDIC), includes, forming a first circuit by a low-end process according to a first design rule such that the first circuit has a first critical dimension, forming a second circuit by a high-end process according to a second design rule smaller than the first design rule such that the second circuit has a second critical dimension smaller than the first critical dimension, and stacking the first circuit and the second circuit in a vertical direction.

DETAILED DESCRIPTION

Figure 1:
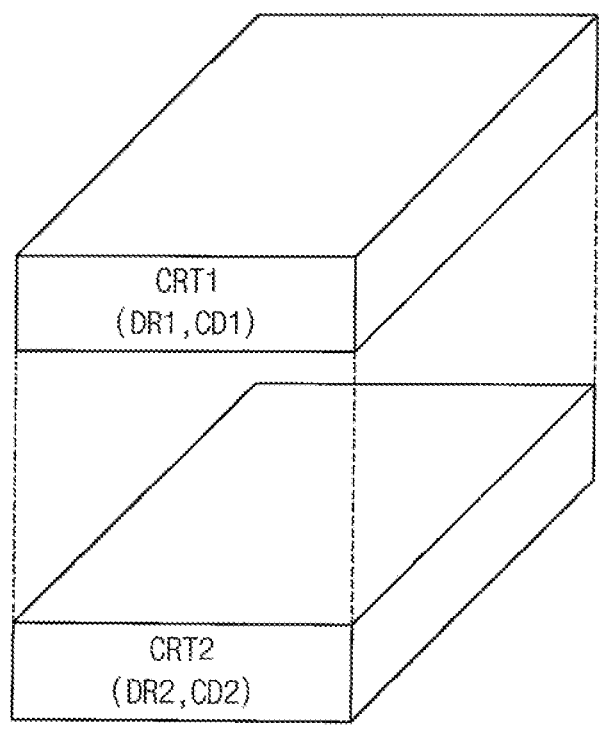
FIG. 1 is a diagram illustrating a stacked display driver integrated circuit (DDIC) according to an example embodiment.

FIG. 1 is a diagram illustrating a stacked display driver integrated circuit (DDIC) according to an example embodiment.

Referring to FIG. 1, a stacked DDIC 200 may include a first circuit CRT1 and a second circuit CRT2 that are stacked in a vertical direction. Although FIG. 1 illustrates that the first circuit CRT1 is stacked over the second circuit CRT2, the second circuit CRT2 may be stacked over the first circuit CRT1.

The first circuit CRT1 may be formed by a low-end process according to a first design rule DR1 such that the first circuit CRT1 may have a first critical dimension CD1. In contrast, the second circuit CRT2 may be formed by a high-end process according to a second design rule DR2, which is smaller than the first design rule SRL such that the second circuit CRT2 may have a second critical dimension CD2 that is smaller than the first critical dimension CD1.

As will be described below with reference to FIGS. 3A and 3B, the first circuit CRT1 may include analog circuits configured to process analog signals, and the second circuit CRT2 may include digital circuits configured to process digital signals and a memory configured to store data. The size of the stacked DDIC 200 according to an example embodiment may be reduced by stacking, in the vertical direction, the first circuit CRT1 including analog circuits and the second circuit CRT2 including digital circuits. In addition, the costs of designing and manufacturing the stacked DDIC 200 may be reduced by forming the analog circuits and the digital circuits through distinct manufacturing processes and performance of the stacked DDIC 200 and the display device including the stacked DDIC 200 may be enhanced.

A design rule indicates a minimum dimension that is one criteria of designing a physical circuit structure. The design rules are a series of parameters provided by manufacturers of semiconductor products and enable designers to verify accuracy of a mask set. The design rules are specific to a semiconductor manufacturing process, and the proper design rules are determined to secure sufficient margin for deviations of the semiconductor manufacturing process. As the design rule decreases, a feature size and a critical dimension of semiconductor devices, which are formed by the semiconductor manufacturing process according to the design rule, are decreased.

Figure 2:
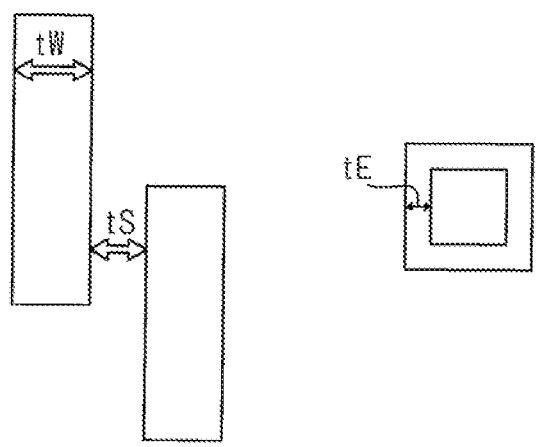
FIG. 2 is a diagram for describing a design rule of a stacked DDIC according to an example embodiment.

FIG. 2 is a diagram for describing a design rule of a stacked DDIC according to an example embodiment.

FIG. 2 illustrates representative design rules. A single layer rule may include a width rule tW and a spacing rule tS. The width rule tW specifies a minimum width of a shape (or a pattern). The spacing rule tS specifies a minimum distance between two adjacent patterns. A two layer rule specifies a relationship between two adjacent layers. For example, an enclosure rule tE specifies that one pattern, such as a contact or a via, has to be covered by a metal layer with a certain additional margin.

Figure 3A:
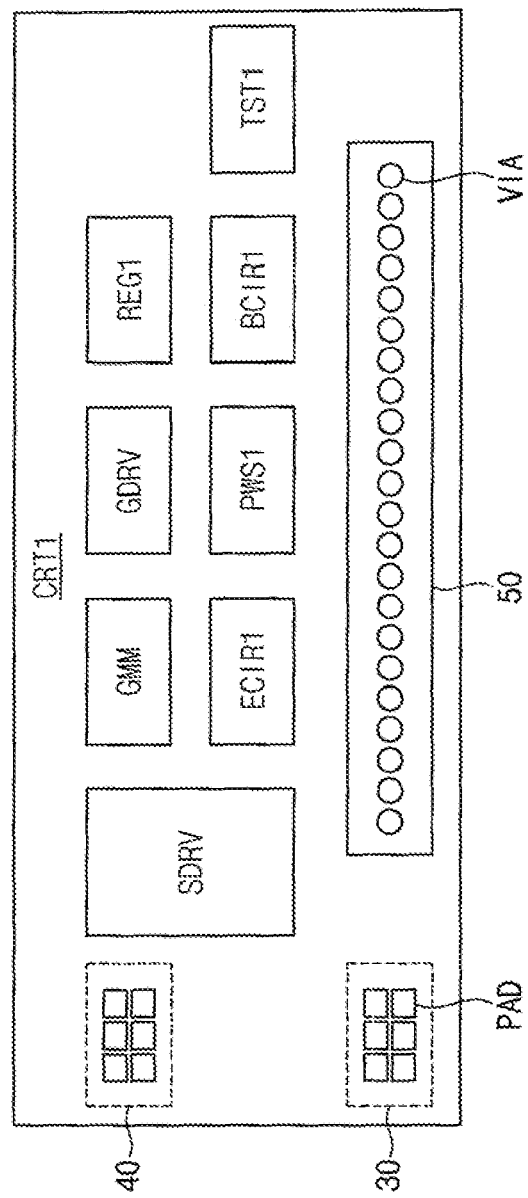
FIGS. 3A and 3B are diagrams illustrating example embodiments of a first circuit and a second circuit included in a stacked DDIC according to an example embodiment.
Figure 3B:
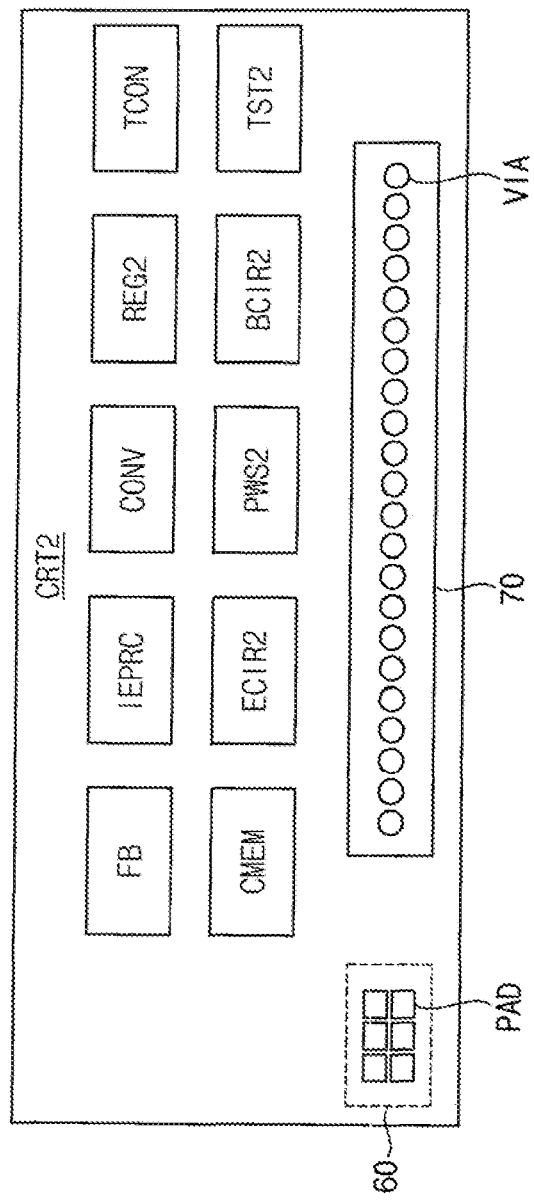

FIGS. 3A and 3B are diagrams illustrating example embodiments of a first circuit and a second circuit included in a stacked DDIC according to an example embodiment.

FIG. 3A illustrates an example embodiment of a first circuit CRT1 that is formed by a low-end process. FIG. 3B illustrates an example embodiment of a second circuit CRT2 that is formed by a high-end process. The first circuit CRT1 includes analog circuits configured to process analog signals. The second circuit CRT2 includes digital circuits configured to process digital signals. In addition, the second circuit CRT2 may further include a memory configured to store data.

Referring to FIG. 3A, the first circuit CRT1 may include pads 30 and 40, vias 50, a source driver SDRV, a gamma circuit GMM, a gate driver GDRV, a register REG1, other circuits ECIR1, a power supply circuit PWS1, a bias circuit BCIR1, and a test circuit TST1.

The pads 30 and 40 may include pads 30 for electrical connection to the second circuit CRT2, and pads 40 for electrical connection to external devices such as a host device and a display panel.

The source driver SDRV or the data driver may apply data signals to the display panel through data lines. The gate driver GDRV or the scan driver may apply scan signals to the display panel through scan lines. The gamma circuit GMM may generate gamma reference voltages based on a regulator voltage. The register REG1 may store control values for operations of the first circuit CRT1. The power supply circuit PWS1 may include a voltage converter, a voltage regulator, etc., to generate operation voltages of the first circuit CRT1. The bias circuit BCIR1 may generate a bias voltage and/or a bias current of the first circuit CRT1. The test circuit TST1 may control tests of the first circuit CRT1 during a wafer stage, a pre-packaging stage, and/or a post-packaging stage.

Referring to FIG. 3B, the second circuit CRT2 may include pads 60, vias 70, a frame buffer FB, an image enhancement processing circuit IEPRC, a panel compensation circuit CONV, a register REG2, a timing controller TCON, a compensation memory CMEM, other circuits ECIR2, a power supply circuit PWS2, a bias circuit BCIR2, and a test circuit TST2.

The pads 60 may include pads for electrical connection to the first circuit CRT1. In an example embodiment, at least a portion of the pads 40 illustrated in FIG. 3A for electrical connection to external devices may be included in the second circuit CRT2.

The timing controller TCON may control operations of the stacked DDIC. The image enhancement processing circuit IEPRC may process image data to generate processed data. The panel compensation circuit CONV may convert the processed data to generate display data driving the display panel. The register REG2 may store control values for operations of the second circuit CRT2. The power supply circuit PWS2 may include a voltage converter, a voltage regulator, etc., to generate operation voltages of the second circuit CRT2. The bias circuit BCIR2 may generate a bias voltage and/or a bias current of the second circuit CRT2. The test circuit TST2 may control tests of the second circuit CRT2 during a wafer stage, a pre-packaging stage, and/or a post-packaging stage. The frame buffer FB may store image data by units of frame. The compensation memory CMEM may store data generated during processing of the image data.

The test circuits TST1 and TST2 may be configured to control respective tests of the first circuit CRT1 and the second circuit CRT2. After the first circuit CRT1 and the second circuit CRT2 are stacked and packaged, the test circuits TST1 and TST2 may be configured to control tests of the stacked DDIC and the display device including the stacked DDIC.

The analog circuits, mainly including the source driver SDRV, and the digital circuits, mainly including the image processing circuits IEPRC and CONV and the memories FB and CMEM, may be manufactured respectively, and the first circuit CRT1 including the analog circuits and the second circuit CRT2 including the digital circuits may be stacked in the vertical direction to form the stacked DDIC controlling the display panel. According to an example embodiment, some components may be disposed differently from FIGS. 3A and 3B considering efficiency in display driving.

In general, a memory embedded in a DDIC for an organic light emitting diode (OLED) display panel having higher resolution of FHD (1920×1080) may occupy a significant area. In addition, the digital circuits for image enhancement and panel compensation may increase. An increase in a size of a DDIC may cause an increase in a size of a bezel of a product such as smartphone, and decrease an effective display area. In case of a flexible display including, for example, a chip on plastic (COP) panel, an increase in size of a DDIC may restrict a size of an embedded battery. Also, manufacturers of a display panel and a mobile device may be more sensitive to an increase in a height of the DDIC than a width of the DDIC, but a chip size increase of a DDIC may tend to cause an increase in a chip height. A stacked DDIC according to an example embodiment may provide an efficient solution to decrease a chip height of a DDIC.

In addition, when a compensation memory of high capacity, e.g., as used for image enhancement and panel compensation, is disposed outside the DDIC, a high speed serial interface (HSSI) may be provided for data transfer between the DDIC and the external compensation memory, which may increase electromagnetic interference (EMI) significantly. According to an example embodiment, the compensation memory, which is one of the digital circuits, may be embedded in the second circuit CRT2. Thus, EMI interference may be reduced or eliminated by connecting the chips, respectively including the first circuit CRT1 and the second circuit CRT2, using, e.g., a low speed parallel interface.

For a DDIC supporting the high resolution (e.g., QHD+), an area ratio of analog circuits and the digital circuits may be about 50:50. A general DDIC having a chip height of about 1600 μm may be replaced with a stacked DDIC according to an example embodiment having the chip height of 850 μm, even when considering an area of vias for inter-chip connection.

In case of an OLED display, solutions to image enhancement are expected to increase the size of the circuits for the image enhancement. In addition, display panels of a low cost may try to improve panel yields by compensating for low panel quality by using panel compensation using memory resources. A process shrink to reduce a chip size of a DDIC may be limited, due the ratio of the analog circuits of about 50%, and may result in an increase in manufacturing cost. A stacked DDIC according to an example embodiment may improve productivity in aspects of the cost in addition to the chip size.

As described above, the additional HSSI for connection between the DDIC and the external compensation memory may cause the increase in the EMI, which may degrade communication quality, for example, in various wireless communications such as long term evolution (LET), global navigation satellite system (GNSS), etc. A general DDIC may adopt various schemes, such as channel shielding, spectrum spread, etc., to reduce EMI between the DDIC and the external compensation memory, which may also increase chip size and manufacturing cost. In contrast, a stacked DDIC according to an example embodiment may include the compensation memory while minimizing or avoiding an increase in the chip size (particularly the chip height rather than the chip width), and the embedded compensation memory may be connected to other circuits using the low speed parallel interface between the stacked circuits inside the stacked DDIC. In addition, the stacked circuits may be connected using through-silicon vias, and thus a length of signal paths may be reduced. As such, a stacked DDIC according to an example embodiment may further reduce the EMI and the power consumption.

For example, a chip width of a mobile device may be greater than 20000 μm and a pitch of through-silicon vias may be smaller than 5 μm, and thus at least 4000 through-silicon vias may be arranged in a line. Also, a number of signal lines between analog circuits and digital circuits in the DDIC may be smaller than 1000. Accordingly, area overhead due to the vias or the through-silicon vias for connecting the first circuit CRT1 and the second circuit CRT2 may be lower than 1%.

Figure 4A:
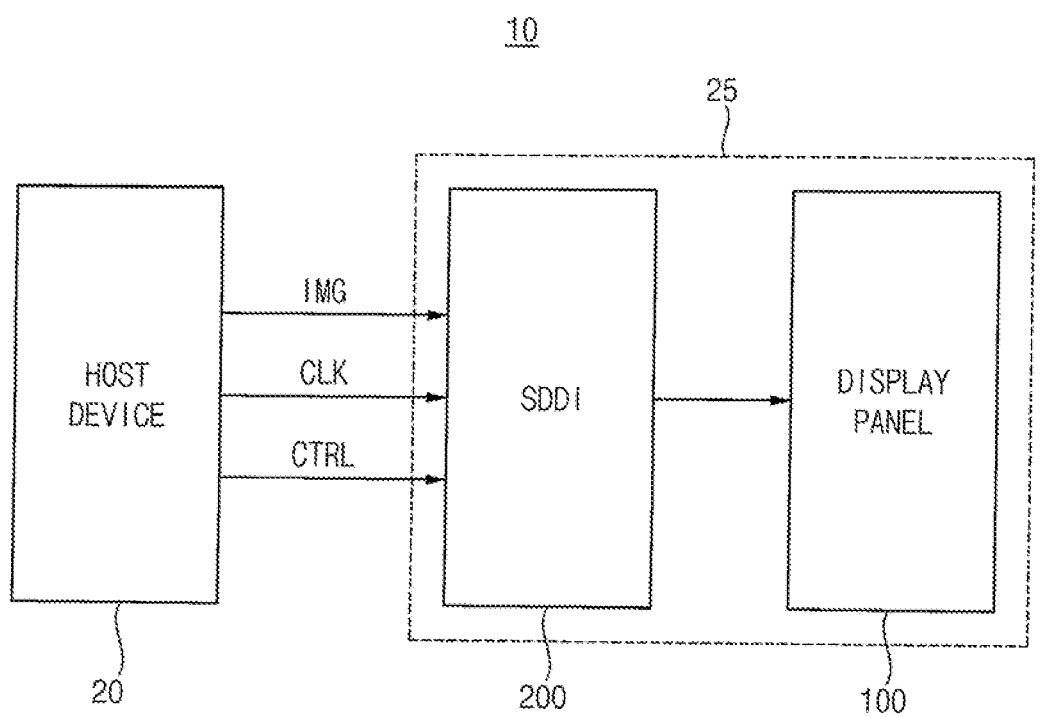
FIG. 4A is a block diagram illustrating a display system according to an example embodiment.

FIG. 4A is a block diagram illustrating a display system according to an example embodiment.

A display system 10 may be various electronic devices having a function of image display such as a mobile phone, a smartphone, a tablet personal computer (PC), a personal digital assistant (PDA), a wearable device, a portable multimedia player (PMP), a handheld device, a handheld computer, etc.

Referring to FIG. 4A, the display system 10 may include a host device (or a host processor) 20 and a display device 25.

The host device 20 may control overall operations of the display system 10. The host device 20 may be an application processor (AP), a baseband processor (BBP), a micro-processing unit (MPU), etc. The host device 20 may provide input image data IMG, a clock signal CLK, and control signals CTRL to the display device 25. For example, the input image data IMG may include RGB pixel values and have a resolution of w*h where width w is a number of pixels in a horizontal direction and height h is a number of pixels in a vertical direction.

The control signals may include a command signal, a horizontal synchronization signal, a vertical synchronization signal, a data enable signal, etc. For example, the input image data IMG and the control signals CTRL may be provided, as a form of a packet, to a stacked DDIC (SDDI) 200 in the display device 25. The command signal may include control information, image information, and/or display setting information. The control information may be used to control a luminance compensation circuit in the stacked DDIC 200 to adjust pixel values of the input image data IMG. The image information may include, for example, a resolution of the input image data IMG. The display setting information may include, for example, panel information, a luminance setting value, etc. For example, the host device 20 may provide, as the display setting information, information according to a user input or according to predetermined setting values.

The stacked DDIC 200 may drive a display panel 100 based on the input image data IMG and the control signals CTRL. The stacked DDIC 200 may convert the digital input image signal IMG to analog signals, and drive the display panel 100 based on the analog signals.

The stacked DDIC 200 according to an example embodiment may include the first circuit CRT1, including the analog circuits, and the second circuit CRT2, including the digital circuits, that are stacked in the vertical direction.

Figure 4B:
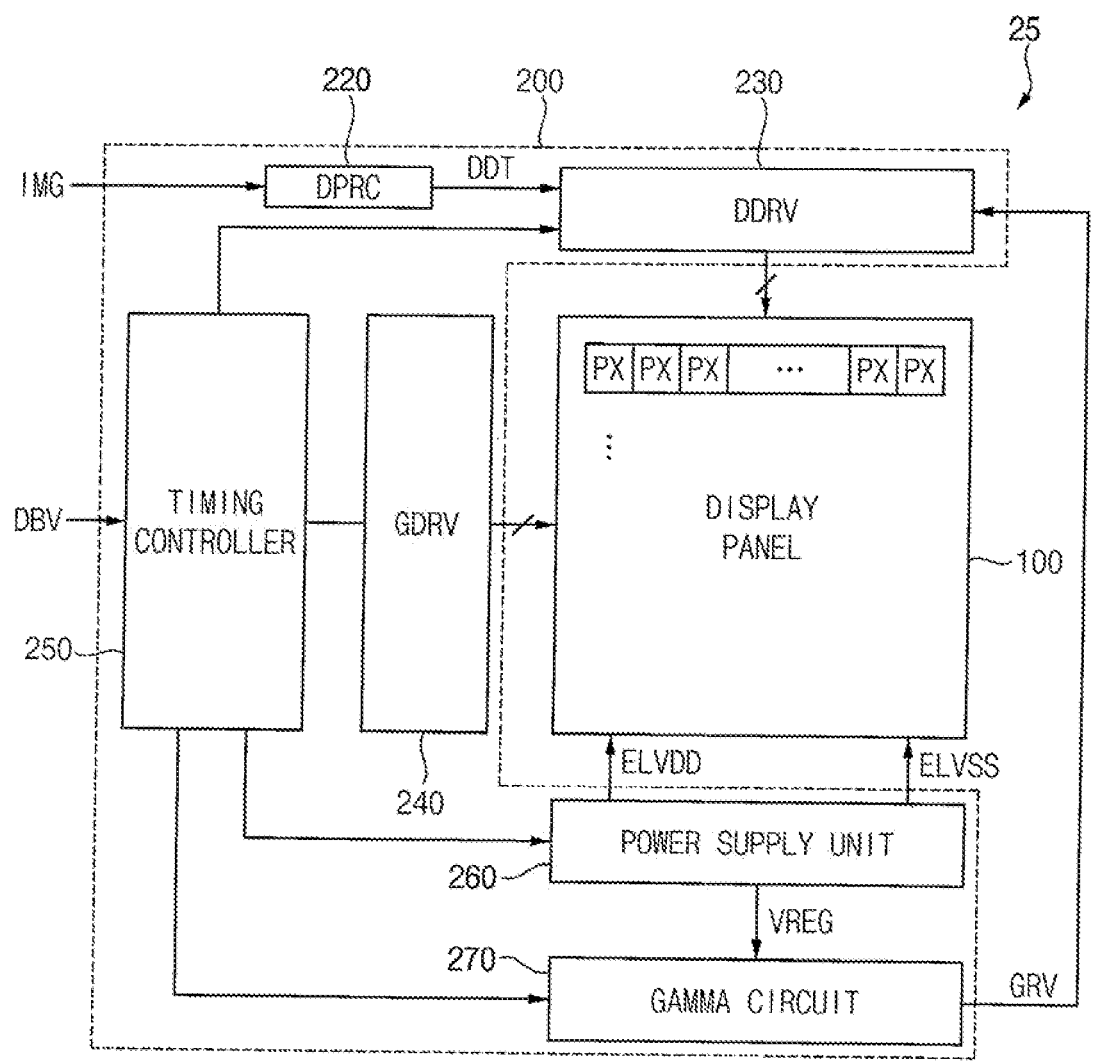
FIG. 4B is a block diagram illustrating a display device according to an example embodiment.

FIG. 4B is a block diagram illustrating a display device according to an example embodiment.

Referring to FIG. 4B, a display device 25 may include the display panel 100, which includes a plurality of pixel rows, and the stacked DDIC 200, which drives the display panel 100.

The stacked DDIC 200 may include a data processing circuit DPRC 220, a source driver or data driver DDRV 230, a scan driver or gate driver GDRV 240, a timing controller 250, a power supply unit 260, and a gamma circuit 270.

The display panel 100 may be connected to the data driver 230 of the stacked DDIC 200 through a plurality of data lines, and may be connected to the scan driver 240 of the stacked DDIC 200 through a plurality of scan lines. The display panel 100 may include a plurality of pixel rows. The display panel 100 may include a plurality of pixels PX arranged in a matrix having a plurality of rows and a plurality of columns. One row of pixels PX connected to the same scan line may be referred to as one pixel row. In an example embodiment, the display panel 100 may be a self-emitting display panel that emits light without the use of a back light unit. For example, the display panel 100 may be an organic light-emitting diode (OLED) display panel.

The pixels PX included in the display panel 100 may have various configurations according to a driving scheme of the display device 25. For example, the display device 25 may be driven with an analog or a digital driving method. While the analog driving method produces grayscale using variable voltage levels corresponding to input data, the digital driving method produces grayscale using variable time duration in which the LED emits light. The analog driving method may use a complex driving integrated circuit (IC) if the display is large and has high resolution. The digital driving method may accomplish high resolution through a simpler IC structure. As the size of the display panel becomes larger and the resolution increases, the digital driving method may have more favorable characteristics over the analog driving method.

The data driver 230 may apply a data signal to the display panel 100 through the data lines. The scan driver 240 may apply a scan signal to the display panel 100 through the scan lines.

The timing controller 250 may control the operation of the display device 25. The timing controller 250 may provide control signals to the data driver 230 and the scan driver 240 to control the operations of the display device 25. In an example embodiment, the data driver 230, the scan driver 240, and the timing controller 250 may be implemented as one integrated circuit (IC). In another example embodiment, the data driver 230, the scan driver 240, and the timing controller 250 may be implemented as two or more integrated circuits. A driving module that includes at least the timing controller 250 and the data driver 230 may be referred to as a timing controller embedded data driver (TED).

The data processing circuit 220 may receive the input image data IMG and input control signals from the host device (e.g., 20 in FIG. 4A) and process the input image data IMG to generate display data DDT. For example, the input image data IMG may include red (R) image data, green (G) image data, and blue (B) image data. According to an example embodiment, the input image data IMG may include white image data, magenta image data, yellow image data, cyan image data, etc. In this disclosure, the input image data IMG is described using RGB data as an example, but the input image data IMG may include various color data other than the red, green, and blue data. The input control signals may include a master clock signal, a data enable signal, a horizontal synchronization signal, a vertical synchronization signal, etc.

The host device 20 may provide a luminance setting value DBV indicating luminance information of the display panel 100 to the timing controller 250. The luminance setting value DBV may be determined automatically depending on the environmental luminance of the display device 25 or manually depending on the user input. The luminance setting value DBV may include dimming information that is determined according to the input image data IMG. For example, the luminance setting value DBV may indicate a maximum luminance value of the display panel 100.

The power supply unit 260 may supply the display panel 100 with the high power supply voltage ELVDD and the low power supply voltage ELVSS. In addition, the power supply unit 260 may supply a regulator voltage VREG to the gamma circuit 270. The gamma circuit 270 may generate gamma reference voltages GRV based on the regulator voltage VREG. The regulator voltage VREG may be the high power supply voltage ELVDD itself or a voltage that is generated based on the high power supply voltage ELVDD.

Figure 5A:
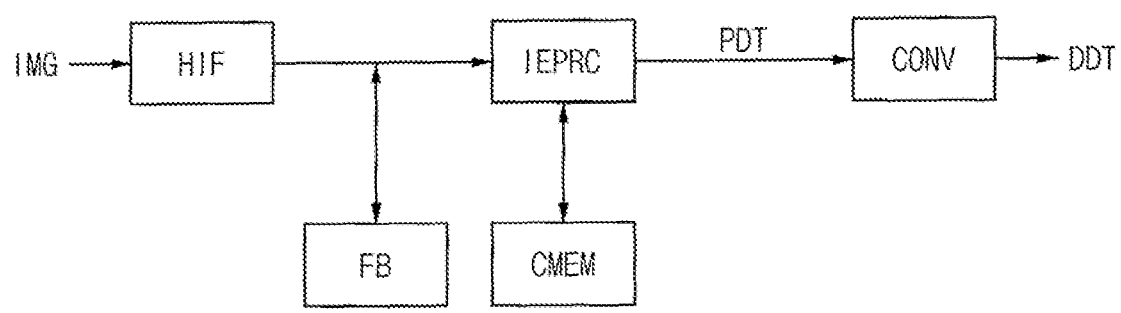
FIG. 5A is a block diagram illustrating an example embodiment of a data processing circuit included in a stacked DDIC according to an example embodiment.

FIG. 5A is a block diagram illustrating an example embodiment of a data processing circuit included in a stacked DDIC according to an example embodiment.

Referring to FIG. 5A, the data processing circuit 220 may include a host interface HIF, the frame buffer FB, the compensation memory CMEM, the image enhancement processing circuit IEPRC, and the panel compensation circuit CONV.

The host interface HIF may receive image data IMG from the host device. The host interface HIF may operate in a manner consistent with published technical standards associated with, for example, the Mobile Industry Processor Interface (MIPI), the Display Port (DP), the embedded DP (eDP) of the Video Electronics Standards Association (VESA), etc.

As the bandwidth of data transfers associated with a display field have increased, high-speed data transfers are increasing. As a result, a low voltage differential signaling (LVDS) scheme may be used in relation to the display field. Because the LVDS scheme is used, data bandwidth may be increased, power consumption may be reduced, manufacturing costs may be reduced, and electro-magnetic interference (EMI) may also be reduced.

The frame buffer FB may store the image data IMG by units of frames, and provide the stored data to the image enhancement processing circuit IEPRC. In a video display mode, the image data IMG may not be stored in the frame buffer FB and may be directly provided to the image enhancement processing circuit IEPRC.

The image enhancement processing circuit IEPRC may process the image data IMG to generate processed data PDT. The image processing operations performed by the image enhancement processing circuit IEPRC will be described below with reference to FIG. 5B. The compensation memory CMEM may store data generated during processing of the image data.

The panel compensation circuit CONV may convert the processed data PDT to generate display data DDT driving the display panel. The image enhancement processing circuit IEPRC may perform data processing such that the same output is provided with respect to the same input. In contrast, the panel compensation circuit CONV may perform data conversion such that the different output is provided with respect to the same input by applying modification to the input. In an example embodiment, the panel compensation circuit CONV may perform dithering with respect to the processed data PDT to generate the display data DDT.

The dithering in image processing indicates a scheme to represent a desired color using difference colors when a computer program cannot represent the desired color. The different colors may be mixed by disposing the different color to adjacent dots (e.g., pixels), similar to pointillism, to represent the desired color when seen from a distance. The panel compensation circuit CONV may adopt an average dithering scheme, a random dithering scheme, a pattern dithering scheme, an ordered dithering scheme, etc. For example, when an image of higher resolution is converted to an image of lower resolution, two or more different colors may be mixed in a boundary region of the different colors.

The image enhancement processing circuit IEPRC may use the compensation memory CMEM having a large memory capacity to store intermediate data generated during the operations of the image enhancement processing circuit IEPRC. As described above, the size of the DDIC may increase if the compensation memory is included in the DDIC, whereas the EMI and the power consumption may increase due to the additional HSSI if the compensation memory CMEM is disposed outside the DDIC.

Figure 5B:
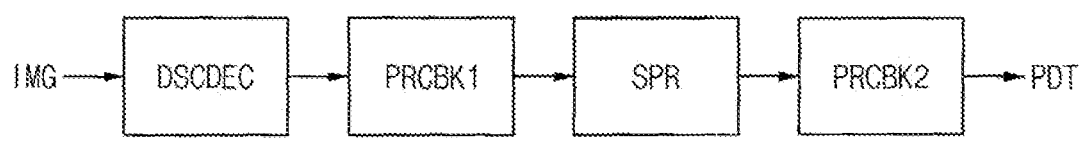
FIG. 5B is a block diagram illustrating an example embodiment of an image enhancement processing circuit included in the data processing circuit of FIG. 5A.

FIG. 5B is a block diagram illustrating an example embodiment of an image enhancement processing circuit included in the data processing circuit of FIG. 5A.

Referring to FIG. 5B, an image enhancement processing circuit 223 may include a display stream compression (DSC) decoder DSCDEC, a first processing unit PRCBK1, a sub pixel rendering unit SPR, and a second processing unit PRCBK2.

The stacked DDIC according to an example embodiment may support data transfer using the DSC decoder DSCDEC, such that the host device may transfer compressed image data IMG. Further, the DSC decoder DSCDEC may decompress the compressed image data IMG to essentially restore the processed image data IMG. However, in some embodiments, the SDC decoder DSCDEC may be omitted.

The first processing unit PRCBK1, the sub pixel rendering unit SPR, and the second processing unit PRCBK2 may form a single pipeline circuit. For example, the first processing unit PRCBK1 may perform one or more functions such as scaling, Always on Display (AoD), mobile digital natural image engine (mDNIe), rounding, etc., and the second processing unit PRCBK2 may perform functions of automatic current limit (ACL), brightness control (BC), IR drop compensation (IRC), pixel optical compensation (POC), etc.

The sub pixel rendering unit SPR may convert a data format of the data output from the first processing unit PRCBK1. For example, the sub pixel rendering unit SPR may convert image data IMG of an RGB format to data of an RG/BG format and provide the data of the RG/BG format to the second processing unit PRCBK2.

The sub pixel rendering unit SPR may convert six color pixels in two RGB clusters to four color pixels in a single RG/BG cluster. If each color pixel is eight bits, the sub pixel rendering unit SPR may convert the data of 8*6=48 bits to the data of 8*4=32 bits to reduce the amount of data.

Figure 6:
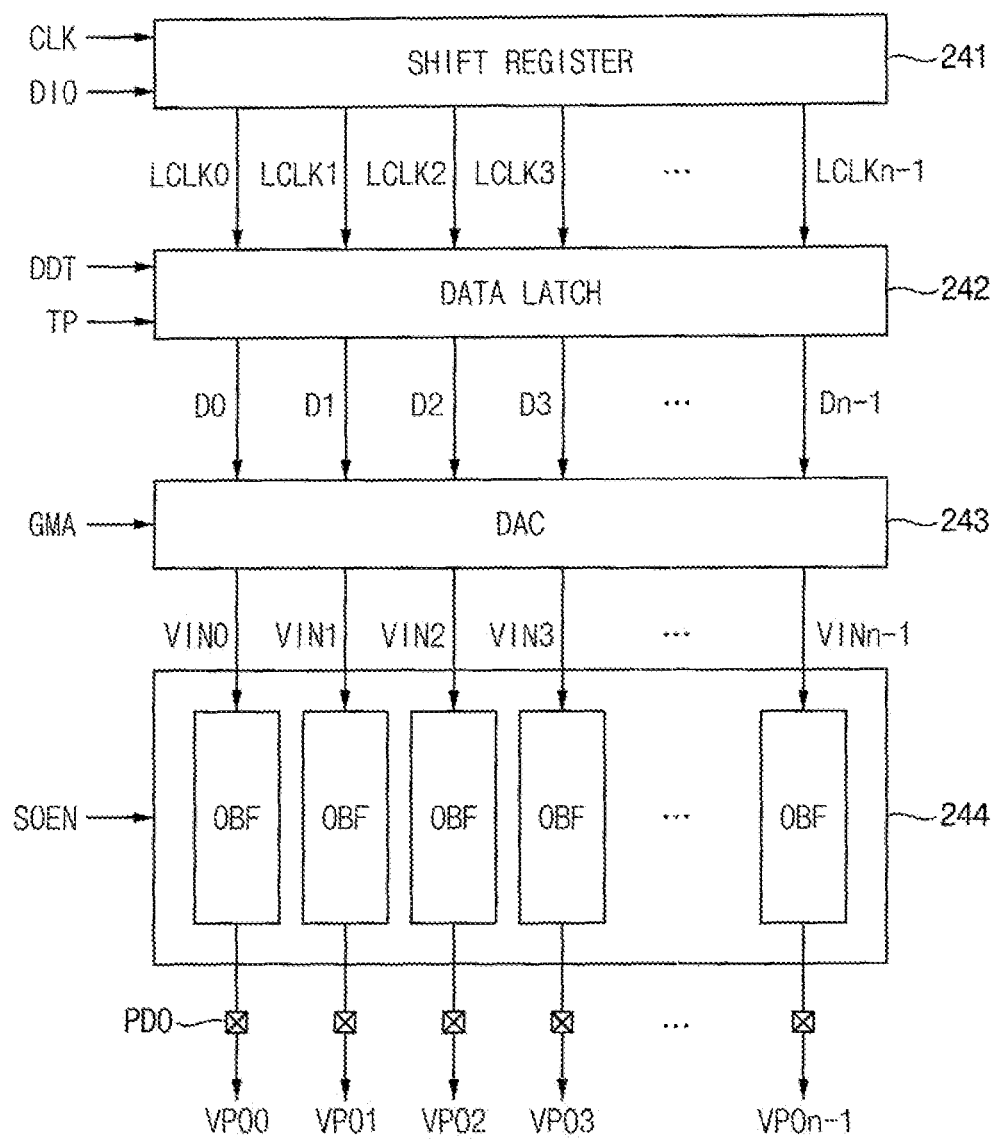
FIG. 6 is a block diagram illustrating an example embodiment of a source driver included in a stacked DDIC according to an example embodiment.

FIG. 6 is a block diagram illustrating an example embodiment of a source driver included in a stacked DDIC according to an example embodiment.

Referring to FIG. 6, the scan driver 240 may include a shift register 241, a data latch 242, a digital-to-analog converter (DAC) 243, and an output buffer block 244.

The shift register 241 may receive a clock signal CLK and an input/output control signal DIO, and may generate a plurality of latch clock signals LCLK0 to LCLKn−1 based on the clock signal CLK. Each of the latch clock signals LCLK0 to LCLKn−1 may determine a latch point in time of the data latch 242 as a clock signal of a specific period.

The data latch 242 may store the display data DDT in response to the latch clock signals LCLK0 to LCLKn−1 provided by the shift register 241. The data latch 242 may output the stored data to the DAC 243 in response to a load signal TP. The data latch 242 may provide output signals D0 to Dn−1 in response to the load signal TP. The DAC 243 may generate input voltages signals VIN0 to VINn−1, which are analog signals corresponding to the output signals D0 to Dn−1 of the data latch 242, using a gray voltage GMA.

The output buffer block 244 may buffer the input voltages signals VIN0 to VINn−1 and may generate source driving signals, for example, the pad output voltage signals VPO0 to VPOn−1. The output buffer block 244 may include a plurality of output buffer circuits OBF respectively driving the source lines.

Figure 7A:
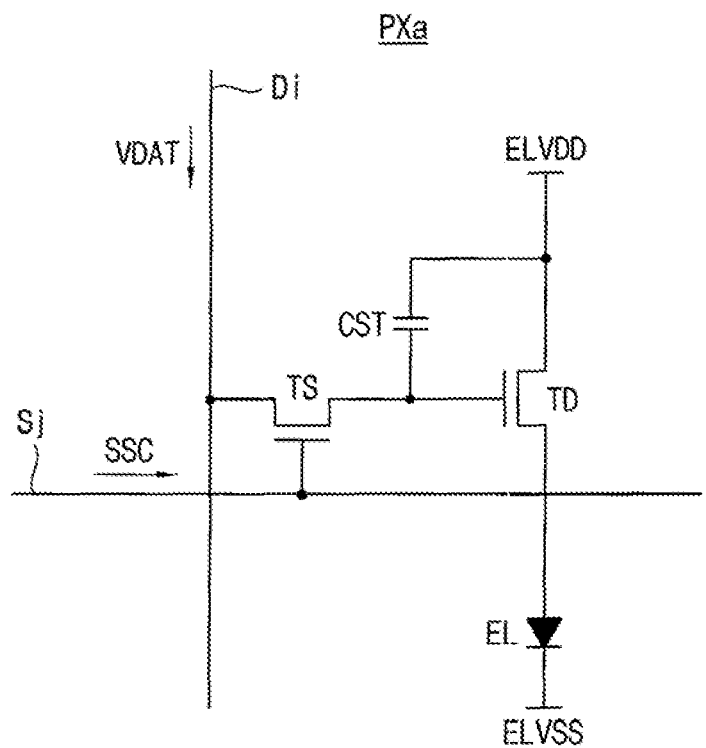
FIGS. 7A and 7B are circuit diagrams illustrating examples of a pixel included in a display panel of a display device according to an example embodiment.
Figure 7B:
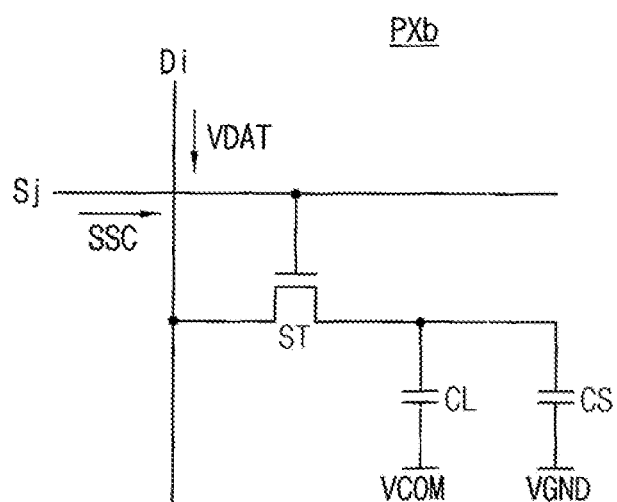

FIGS. 7A and 7B are circuit diagrams illustrating examples of a pixel included in a display panel of a display device according to an example embodiment.

Referring to FIG. 7A, each pixel PXa may include a switching transistor TS, a storage capacitor CST, a driving transistor TD, and an organic light emitting diode EL.

The switching transistor TS may have a first electrode connected to a data line Di, a second electrode connected to the storage capacitor CST, and a gate electrode connected to a scan line Sj. The switching transistor TS may transfer a data voltage VDAT received from the data driver to the storage capacitor CST in response to a scan signal SSC received from the scan driver.

The storage capacitor CST may have a first electrode connected to a first power supply voltage ELVDD and a second electrode connected to a gate electrode of the driving transistor TD. The storage capacitor CST may store the data voltage VDAT transferred through the switching transistor TS.

The driving transistor TD may have a first electrode connected to the first power supply voltage ELVDD, a second electrode connected to the organic light emitting diode EL, and the gate electrode connected to the storage capacitor CST. The driving transistor TD may be turned on or off depending on the data voltage VDAT stored in the storage capacitor CST.

The organic light emitting diode EL may have an anode electrode connected to the driving transistor TD and a cathode electrode connected to a second power supply voltage ELVSS. The organic light emitting diode EL may emit light based on a current flowing from the first power supply voltage ELVDD to the second power supply voltage ELVSS while the driving transistor TD is turned on. The brightness of the pixel PX may increase as the current flowing through the organic light emitting diode EL increases. For example, the first power supply voltage ELVDD may be a high power supply voltage, and the second power supply voltage ELVSS may be a low power supply voltage.

In an example embodiment, the display panel including the pixel PXa may be a self-emitting display panel that emits light without the use of a backlight unit. For example, the display panel may be an organic light emitting display panel that includes an organic light emitting diode (OLED) as the light emitting element.

In an example embodiment, the display panel including the pixel PXa may have good retention characteristics capable of performing a low frequency driving. For example, the display panel may be an oxide-based organic light emitting display panel that includes an organic light emitting diode as the light emitting element and includes the transistor including low-temperature polycrystalline oxide (LTPO).

In an example embodiment, the switching transistor TS and the driving transistor TD may include LTPO. For example, the driving transistor TD may be a low-temperature poly-silicon (LTPS) thin film transistor (TFT) including LTPS, and the switching transistor TS may be an oxide TFT including an oxide semiconductor. The LTPS TFT may be desirable for current driving because of relatively high electron mobility. The oxide TFT may be desirable for switching because of relatively low leakage current. Thus, when the LTPS TFT and the oxide TFT are used together, excellent characteristics (e.g., the excellent retention characteristics) may be obtained. A pixel that includes both the LTPS TFT and the oxide TFT may be referred to as a LTPO pixel, and a display panel that includes the LTPO pixel may be referred to as a hybrid oxide panel (HOP). For example, the HOP may maintain an image for a maximum of about one second with a single update, and thus the HOP may be driven with relatively low frequency even if the display driver integrated circuit does not include a frame buffer, thereby reducing the power consumption.

In an example embodiment, the pixel PXa may have various configurations depending on a driving scheme of the display device. For example, the display device may be driven with an analog or a digital driving scheme. While the analog driving scheme produces grayscale using variable voltage levels corresponding to input data, the digital driving scheme produces grayscale using a variable time duration in which the light emitting diode emits light. The analog driving scheme may use a complex a driving integrated circuit (IC) if the display is large and has a high resolution. The digital driving scheme may provide high resolution through a simpler IC structure.

Referring to FIG. 7B, each pixel PXb may include a switching transistor ST, a liquid crystal capacitor CL, and a storage capacitor CS.

The switching transistor ST may connect the capacitors CL and CST to a corresponding data line Di in response to a scan signal SSC transferred through a corresponding gate line Sj. The liquid crystal capacitor CL may be connected between the switching transistor ST and a common voltage VCOM. The storage capacitor CST may be connected between the switching transistor ST and a ground voltage VGND. The liquid crystal capacitor CL may adjust the amount of transmitted light depending on data stored in the storage capacitor CST by a data voltage VDAT. In an example embodiment, the display panel including the pixel PXb may be a liquid crystal display (LCD) panel using a backlight. The liquid crystal display panel may also operate based on the low frequency driving.

The stacked DDIC according to an example embodiment and the display panel may be implemented as one module (or one assembly), which may be referred to as the display device. In an example embodiment, the stacked DDIC may be mounted on a circuit film such as a tape carrier package (TCP), a chip on film (COF), a flexible print circuit (FPC), etc., and may be attached to the display panel by a tape automatic bonding (TAB) scheme. In an example embodiment, the stacked DDIC may be mounted on a non-display region of the display panel by a chip on glass (COG) scheme or a chip on plastic (COP) scheme.

Hereinafter, an example embodiment of a display system of the COP scheme is described with reference to FIG. 8.

Figure 8:
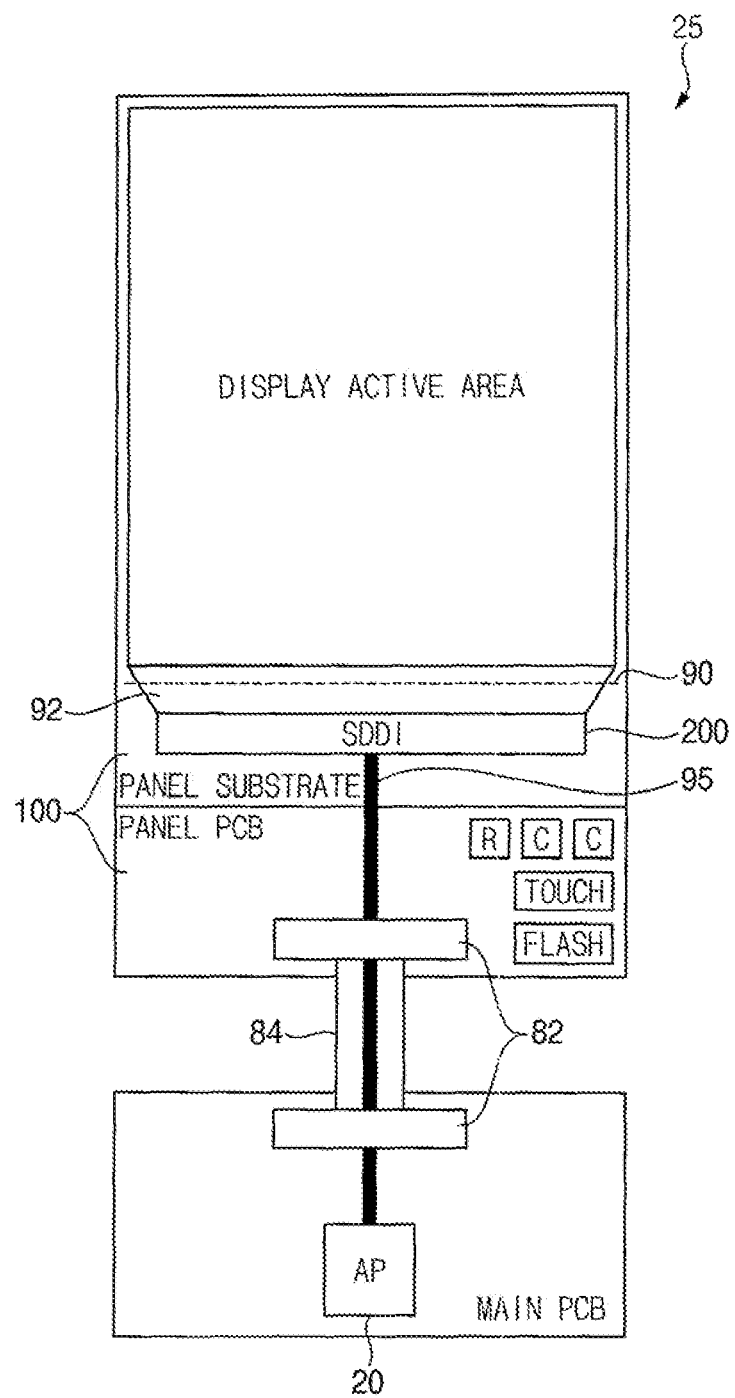
FIG. 8 is a diagram illustrating a display system according to an example embodiment.

FIG. 8 is a diagram illustrating a display system according to an example embodiment.

Referring to FIG. 8, a display system may include the host device 20 such as an application processor AP mounted on a main printed circuit board (PCB), and the display device 25 connected to the host device 20. The display device 25 may include the display panel 100 and the stacked DDIC (SDDI) 200.

The display panel 100 may include a panel PCB and a panel substrate that is mounted on the panel PCB. The display panel 100 may be implemented as a flexible panel and a line portion 90 may be bent such that the bent portion below the line portion 90 may be disposed under the display active area. Passive components such as registers R, capacitors C, circuits associated with touch function, a flash memory, etc., may be mounted on the panel PCB.

The stacked DDIC 200 mounted on the panel substrate may be electrically connected to electrodes 92 of the display panel 100. In addition, the stacked DDIC 200 may be electrically connected to the host device 20 through signal lines 95. For example, the signal lines 95 may include a first portion in the display panel 100, a second portion in a flexible cable 84 between connectors 82, and a third portion in the main PCB. The interface between the stacked DDIC and the host device 20 may be implemented with a high speed serial interface HSSI consistent with the standards such as the Mobile Industry Processor Interface (MIPI), the Display Port (DP), the embedded DP (eDP) of the Video Electronics Standards Association (VESA), etc.

FIGS. 9A through 12 are cross-sectional diagrams illustrating a stacked DDIC according to an example embodiment.

Figure 9A:
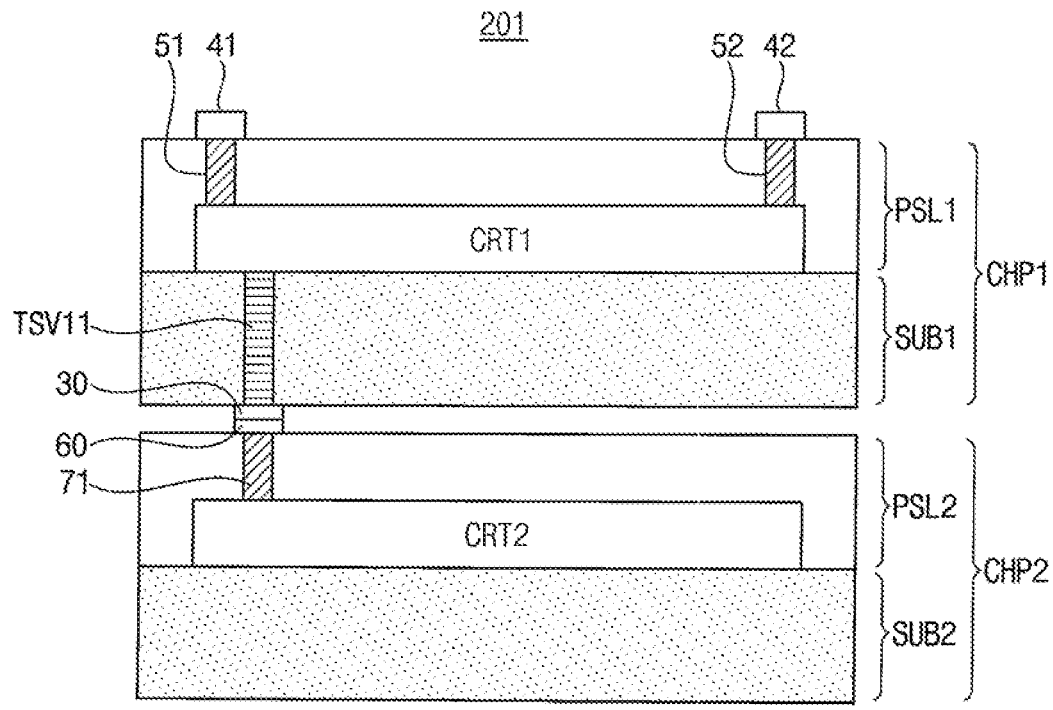
FIGS. 9A through 12 are cross-sectional diagrams illustrating a stacked DDIC according to an example embodiment.
Figure 9B:
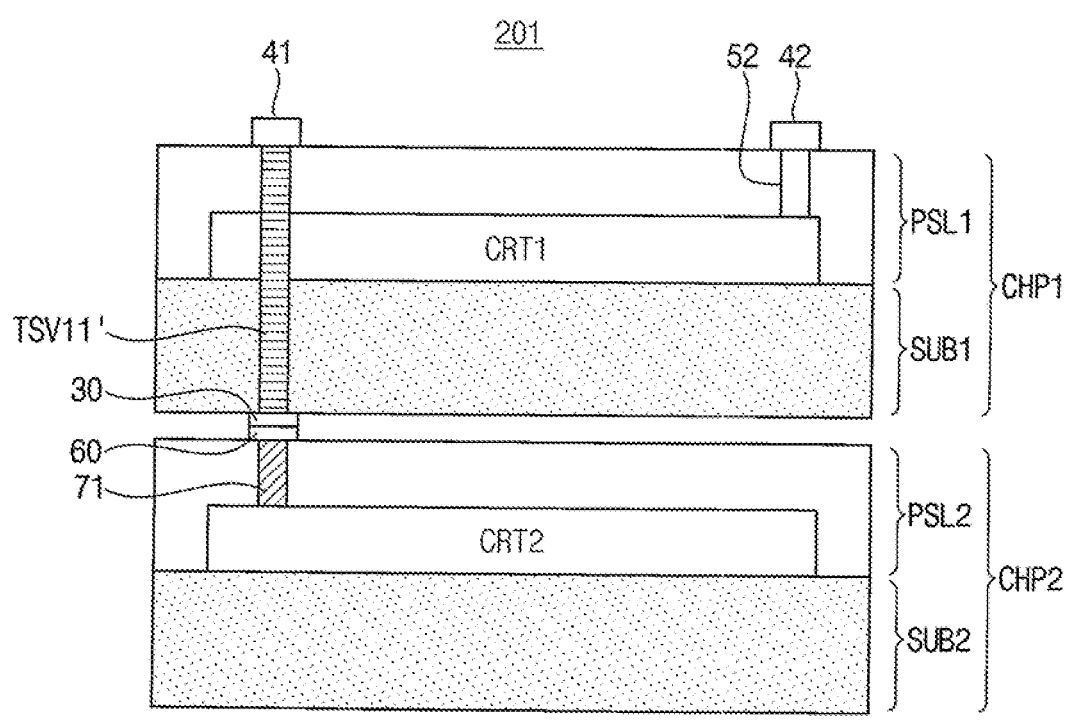

Referring to FIGS. 9A and 9B, a stacked DDIC 201 may include a first semiconductor chip CHP1 and a second semiconductor chip CHP2. The stacked DDIC 201 may have a face-to-back stack structure such that a bottom surface of the first semiconductor chip CHP1 is opposite to an upper surface of the second semiconductor chip CHP2.

The first semiconductor chip CHP1 may include a first semiconductor substrate SUB1 and a first passivation layer PSL1 such that the first circuit CRT1 is formed on an upper surface of the first semiconductor substrate SUB1, and the first passivation later PSL1 covers the first circuit CRT1 and the upper surface of the first semiconductor substrate SUB1. The second semiconductor chip CHP2 may include a second semiconductor substrate SUP2 and a second passivation layer PSL2 such that the second circuit CRT2 is formed on an upper surface of the second semiconductor substrate SUB2, and the second passivation later PSL2 covers the second circuit CRT2 and the upper surface of the second semiconductor substrate SUB2.

First bonding pads 30 may be disposed on the bottom surface of the first semiconductor chip CHP1. Second bonding pads 60 may be disposed on the upper surface of the second semiconductor chip CHP2 such that the second bonding pads 60 may be electrically connected to the first bonding pads 30. FIGS. 9A and 9B illustrate an example embodiment that the first bonding pads 30 are directly connected to the second bonding pads 60; in another example embodiment, micro bumps may be interposed between the first bonding pads 30 and the second bonding pads 60.

In an example embodiment, as illustrated in FIG. 9A, through-silicon vias TSV11 may pass through the first semiconductor substrate SUB1 and electrically connect the first bonding pads 30 and the first circuit CRT1, and vias 71 may be disposed in the second passivation layer PSL2 and electrically connect the second bonding pads 60 and the second circuit CRT2.

In an example embodiment, as illustrated in FIG. 9B, through-silicon vias TSV11' may pass through the first semiconductor substrate SUB1 and the first passivation layer PSL1, and electrically connect the first bonding pads 30, the first circuit CRT1, and host connection pads 41.

The host connection pads 41 may be disposed on an upper surface of the first semiconductor chip CHP1 and electrically connected to a host device. In addition, panel connection pads 42 may be disposed on the upper surface of the first semiconductor chip CHP1 and electrically connected to a display panel.

First vias 51 may be disposed in the first passivation layer PSL1 and electrically connect the host connection pads 41 and the first circuit CRT1. Second vias 52 may be disposed in the first passivation layer PSL1 and electrically connect the panel connection pads 42 and the first circuit CRT1.

Figure 10:
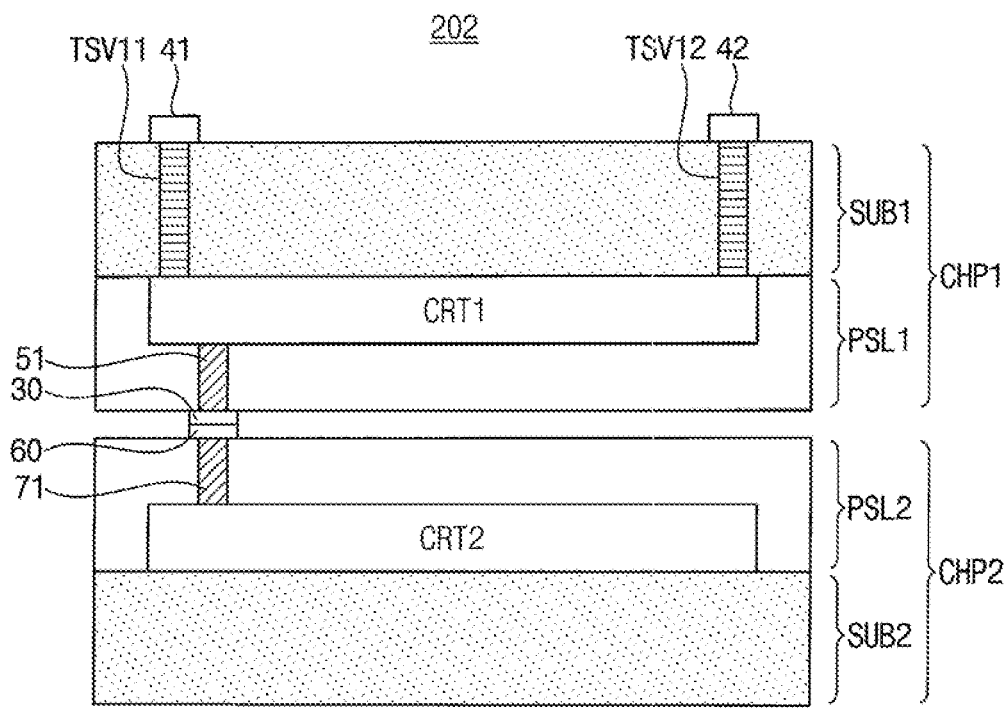

Referring to FIG. 10, a stacked DDIC 202 may include a first semiconductor chip CHP1 and a second semiconductor chip CHP2. The stacked DDIC 202 may have a face-to-face stack structure such that an upper surface of the first semiconductor chip CHP1 is opposite to an upper surface of the second semiconductor chip CHP2.

The first semiconductor chip CHP1 may include a first semiconductor substrate SUB1 and a first passivation layer PSL1 such that the first circuit CRT1 is formed on an upper surface of the first semiconductor substrate SUB1, and the first passivation later PSL1 covers the first circuit CRT1 and the upper surface of the first semiconductor substrate SUB1. The second semiconductor chip CHP2 may include a second semiconductor substrate SUP2 and a second passivation layer PSL2 such that the second circuit CRT2 is formed on an upper surface of the second semiconductor substrate SUB2, and the second passivation later PSL2 covers the second circuit CRT2 and the upper surface of the second semiconductor substrate SUB2.

First bonding pads 30 may be disposed on the upper surface of the first semiconductor chip CHP1. Second bonding pads 60 may be disposed on the upper surface of the second semiconductor chip CHP2 such that the second bonding pads 60 may be electrically connected to the first bonding pads 30. FIG. 10 illustrates an example embodiment that the first bonding pads 30 are directly connected to the second bonding pads 60; in another example embodiment, micro bumps may be interposed between the first bonding pads 30 and the second bonding pads 60.

First vias 51 may be disposed in the first passivation layer PSL1 and electrically connect the first bonding pads 30 and the first circuit CRT1. Second vias 71 may be disposed in the second passivation layer PSL2 and electrically connect the second bonding pads 60 and the second circuit CRT2.

Host connection pads 41 may be disposed on a bottom surface of the first semiconductor chip CHP1 and electrically connected to a host device. Panel connection pads 42 may be disposed on the bottom surface of the first semiconductor chip CHP1 and electrically connected to a display panel.

First through-silicon vias TSV11 may pass through the first semiconductor substrate SUB1 and electrically connect the host connection pads 41 and the first circuit CRT1. Second through-silicon vias TSV12 may pass through the first semiconductor substrate SUB1, and electrically connect the panel connection pads 42 and the first circuit CRT1.

Figure 11:
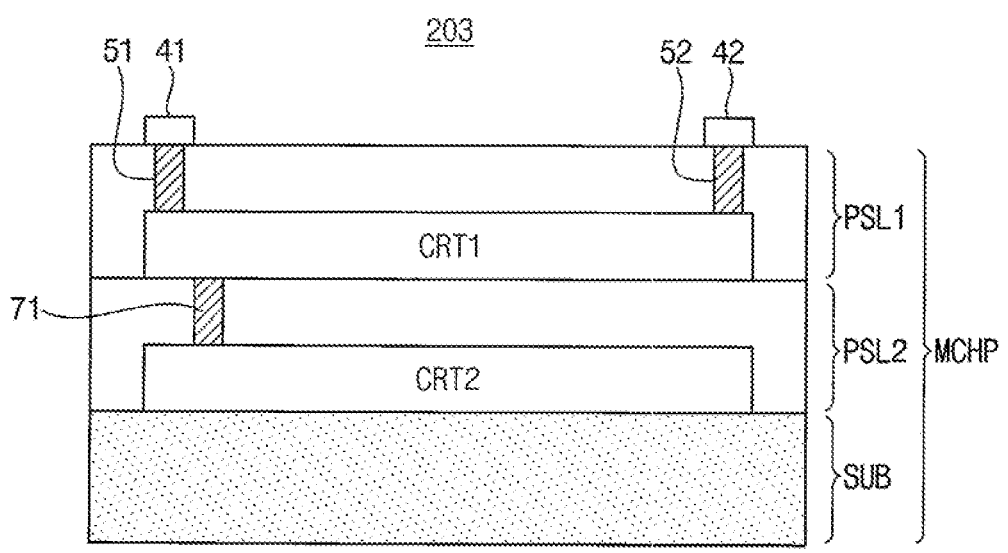

Referring to FIG. 11, a stacked DDIC 203 may be implemented as a single semiconductor chip MCHP. The stacked DDIC 203 may have a monolithic stack structure such that the first circuit CRT1 and the second circuit CRT2 are stacked in the vertical direction on a single semiconductor substrate SUB.

The semiconductor chip MCHP may include a semiconductor substrate SUB, a first passivation layer PSL1, and a second passivation layer PSL2. The second circuit CRT2 may be formed on the semiconductor substrate SUB, and the second passivation layer PSL2 may cover the second circuit CRT2 and the upper surface of the semiconductor substrate SUB. The first circuit CRT1 may be formed on the second passivation layer PSL2, and the first passivation layer PSL1 may cover the first circuit CRT1 and the upper surface of the second passivation layer PSL2. In an example embodiment, an epitaxial layer may be formed on the second passivation layer PSL2, and the first circuit CRT1 may be formed using the epitaxial layer.

Vias 71 may be disposed in the second passivation layer PSL2 and electrically connect the first circuit CRT1 and the second circuit CRT2.

Host connection pads 41 may be disposed on an upper surface of the semiconductor chip MCHP and electrically connected to a host device. Panel connection pads 42 may be disposed on the upper surface of the semiconductor chip MCHP and electrically connected to a display panel.

First vias 51 may be disposed in the first passivation layer PSL1, and electrically connect the host connection pads 41 and the first circuit CRT1. Second vias 52 may be disposed in the first passivation layer PSL1, and electrically connect the panel connection pads 42 and the first circuit CRT1.

In an example embodiment, the first circuit CRT1 may be stacked above the second circuit CRT2 as described with reference to FIGS. 9A through 11. In an example embodiment, the second circuit CRT2 may be stacked above the first circuit CRT1 as will be described below with reference to FIG. 12.

Figure 12:
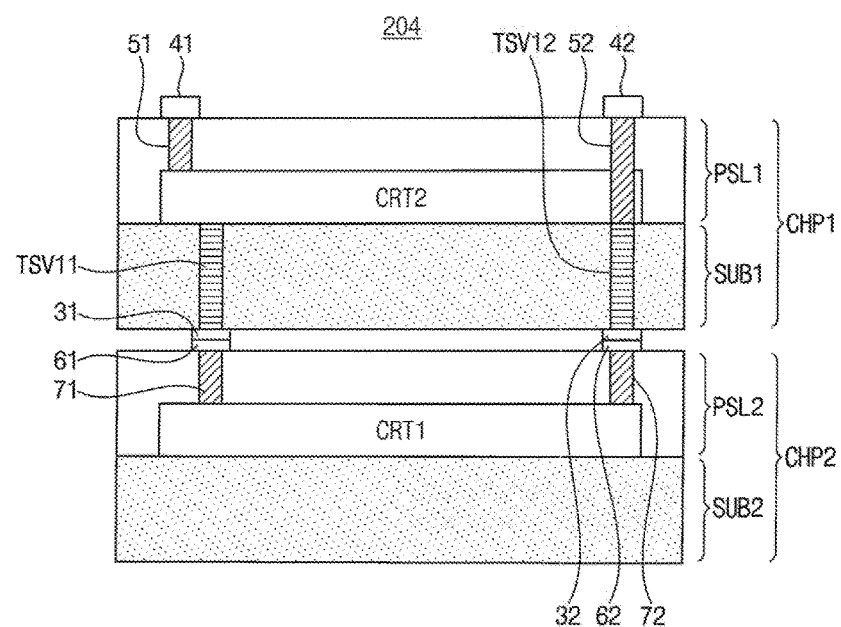

Referring to FIG. 12, a stacked DDIC 204 may include a first semiconductor chip CHP1 and a second semiconductor chip CHP2. The stacked DDIC 204 may have a face-to-back stack structure such that a bottom surface of the first semiconductor chip CHP1 is opposite to an upper surface of the second semiconductor chip CHP2.

The first semiconductor chip CHP1 may include a first semiconductor substrate SUB1 and a first passivation layer PSL1 such that the second circuit CRT2 is formed on an upper surface of the first semiconductor substrate SUB1, and the first passivation later PSL1 covers the second circuit CRT2 and the upper surface of the first semiconductor substrate SUB1. The second semiconductor chip CHP2 may include a second semiconductor substrate SUP2 and a second passivation layer PSL2 such that the first circuit CRT1 is formed on an upper surface of the second semiconductor substrate SUB2, and the second passivation later PSL2 covers the first circuit CRT1 and the upper surface of the second semiconductor substrate SUB2.

First bonding pads 31 may be disposed on the bottom surface of the first semiconductor chip CHP1. Second bonding pads 61 may be disposed on the upper surface of the second semiconductor chip CHP2 such that the second bonding pads 61 may be electrically connected to the first bonding pads 31. FIG. 12 illustrates an example embodiment that the first bonding pads 31 are directly connected to the second bonding pads 61; in another example embodiment, micro bumps may be interposed between the first bonding pads 31 and the second bonding pads 61.

First through-silicon vias TSV11 may pass through the first semiconductor substrate SUB1 and electrically connect the first bonding pads 31 and the second circuit CRT2, and vias 71 may be disposed in the second passivation layer PSL2 and electrically connect the second bonding pads 61 and the first circuit CRT1.

The host connection pads 41 may be disposed on an upper surface of the first semiconductor chip CHP1 and electrically connected to a host device. In addition, panel connection pads 42 may be disposed on the upper surface of the first semiconductor chip CHP1 and electrically connected to a display panel.

Vias 51 may be disposed in the first passivation layer PSL1 and electrically connect the host connection pads 41 and the second circuit CRT2.

Second through-silicon vias TSV12 may pass through the first semiconductor substrate SUB1. Second vias 52 may be disposed in the first passivation layer PSL1, and electrically connect the second through-silicon vias TSV12 and the panel connection pads 42.

Third bonding pads 32 may be disposed on the bottom surface of the first semiconductor chip CHP1. Fourth bonding pads 62 may be disposed on the upper surface of the second semiconductor chip CHP2 such that the fourth bonding pads 62 may be electrically connected to the third bonding pads 32. The vias 72 may be disposed in the second passivation layer PSL2, and electrically connect the fourth bonding pads 62 and the first circuit CRT1. As a result, the panel connection pads 42 may be electrically connected to the first circuit CRT1 through the vias 52, the second through-silicon vias TSV12, the third and fourth bonding pads 32 and 62, and the vias 72.

Also, a stacked DDIC according to an example embodiment may have the face-to-face stack structure as described with reference to FIG. 10 and the second circuit CRT2 may be stacked above the first circuit CRT1 as described with reference to FIG. 12.

Figure 13:
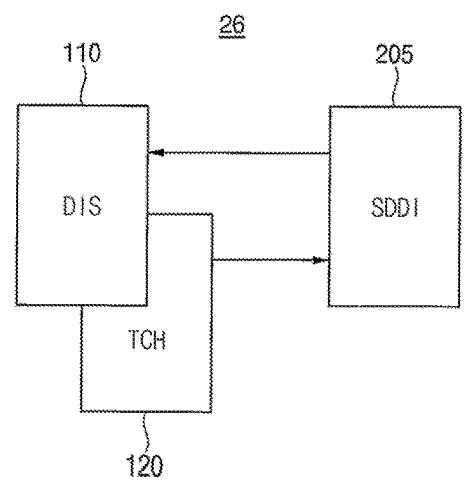
FIG. 13 is a diagram illustrating a display device according to an example embodiment.

FIG. 13 is a diagram illustrating a display device according to an example embodiment.

Referring to FIG. 13, a display device 26 may include a display panel (DIS) 110, a touch panel (TCH) 120, and a stacked DDIC (SDDI) 205.

The display panel 110 may display images based on display data provided from the stacked DDIC 205. The touch panel 120 may provide information corresponding to a touch operation of a user to the stacked DDIC 205. In an example embodiment, the display panel 110 and the touch panel 120 may be combined into a touchscreen. The touch screen may indicate a device of a screen shape such that components for display function and components for touch function are superimposed and coalesced.

Figure 14A:
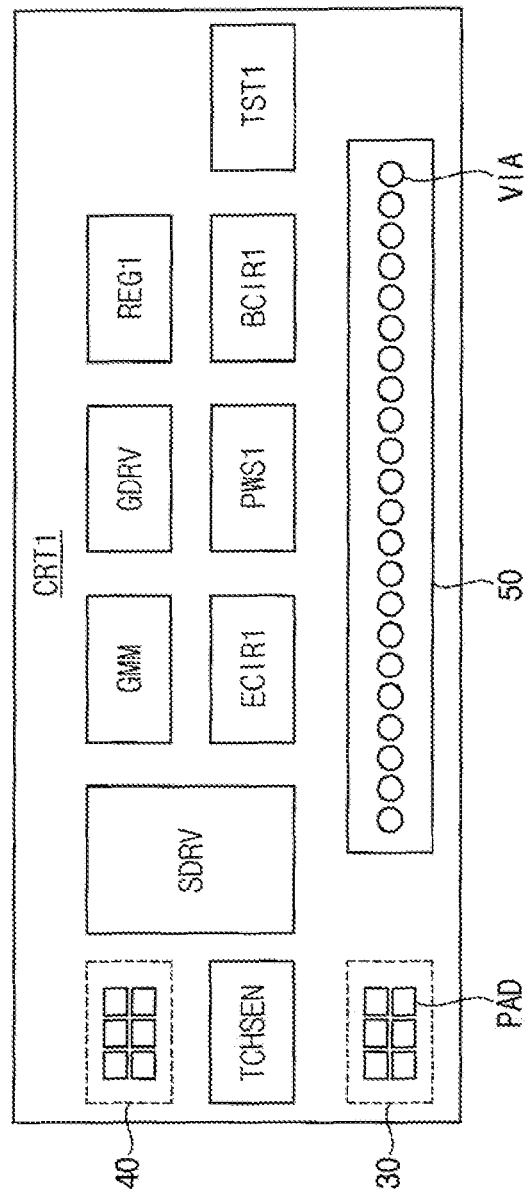
FIGS. 14A and 14B are diagrams illustrating example embodiments of a first circuit and a second circuit included in a stacked DDIC according to an example embodiment.
Figure 14B:
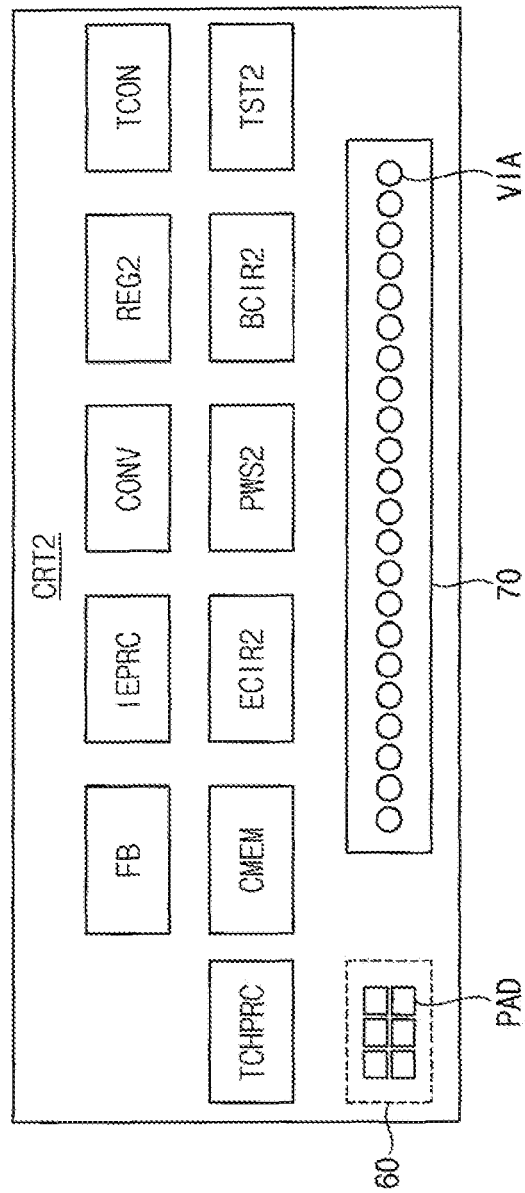

FIGS. 14A and 14B are diagrams illustrating example embodiments of a first circuit and a second circuit included in a stacked DDIC according to an example embodiment. The descriptions repeated with FIGS. 3A and 3B may be omitted.

Referring to FIGS. 14A and 14B, the first circuit CRT1 included in the stacked DDIC 205 in FIG. 13 may further include a touch sensor TCHSEN, and the second circuit CRT2 included in the stacked DDIC 205 may further include a touch processing circuit TCHPRC.

The touch sensor TCHSEN may detect an analog signal corresponding to a touch operation of a user and provided from the touch panel 120. The touch sensor TCHSEN may convert the analog signal to generate a digital signal corresponding to the touch operation. The touch processing circuit TCHPRC may process the digital signal corresponding to the touch operation to generate a control signal corresponding to the touch operation. The touch sensor TCHSEN corresponds to an analog circuit and the touch processing circuit TCHPRC corresponds to a digital circuit.

Figure 15:
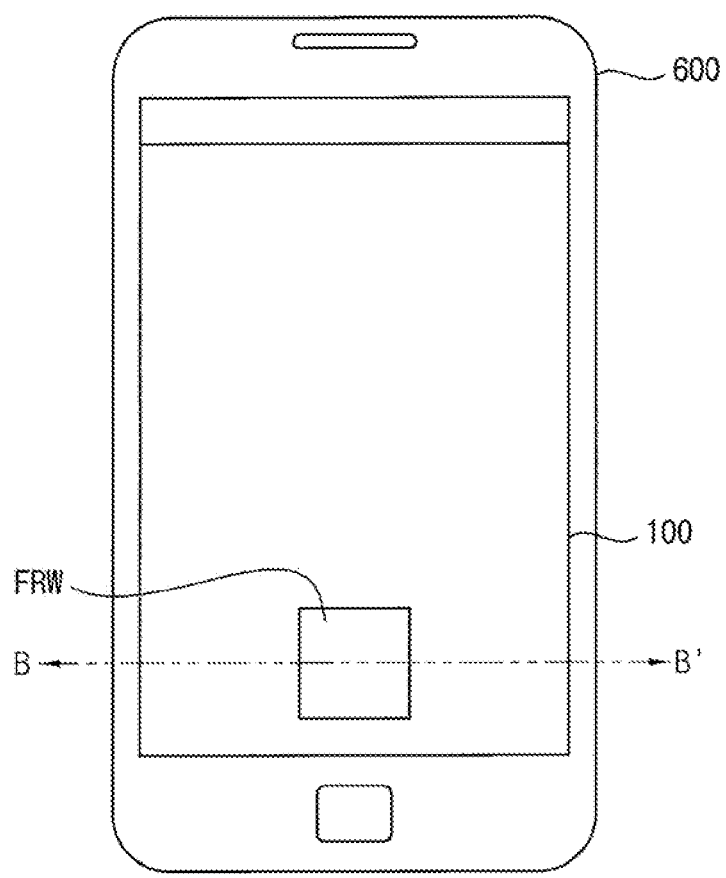
FIG. 15 is a diagram illustrating a mobile device performing optical fingerprint recognition according to an example embodiment.
Figure 15:
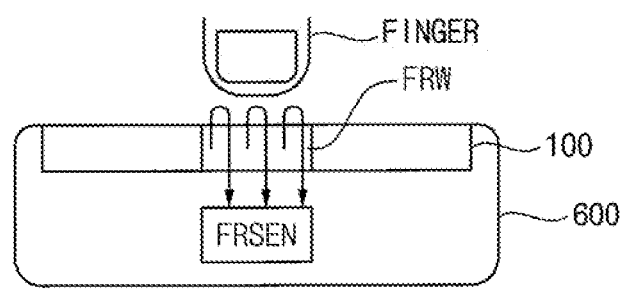

FIG. 15 is a diagram illustrating a mobile device performing optical fingerprint recognition according to an example embodiment. A mobile device 600 such as a smart phone is illustrated in an upper portion of FIG. 15 and a cross-sectional view of the mobile device 600 along a cutting line B-B' is illustrated in a lower portion of FIG. 15.

Referring to FIG. 15, a fingerprint recognition window FRW may be displayed on a portion of a display panel 100 in a fingerprint recognition mode. The fingerprint recognition sensor FRSEN is disposed under the display panel 100 such that the fingerprint recognition sensor FRSEN may overlap the fingerprint recognition window FRW in the vertical direction. When a user puts a finger on the fingerprint recognition window FRW, the light generated from the pixels of the fingerprint recognition window FRW is reflected by a fingerprint of the finger and the reflected light is provided to the fingerprint recognition sensor FRSEN. The fingerprint recognition sensor FRSEN may capture the fingerprint image based on the reflection light received through the fingerprint recognition window FRW.

Figure 16A:
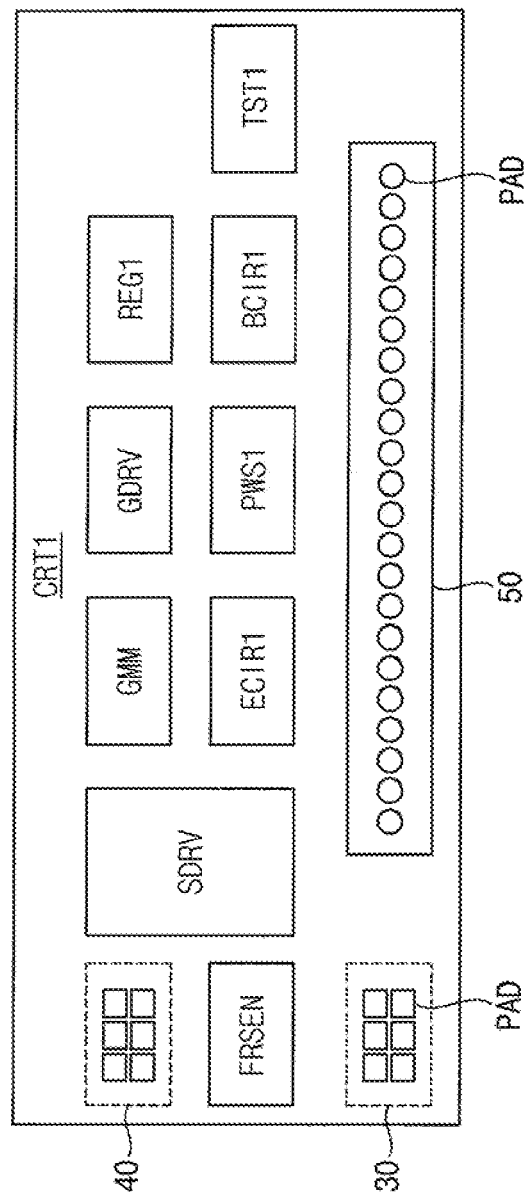
FIGS. 16A and 16B are diagrams illustrating example embodiments of a first circuit and a second circuit included in a stacked DDIC in the mobile device of FIG. 15.
Figure 16B:
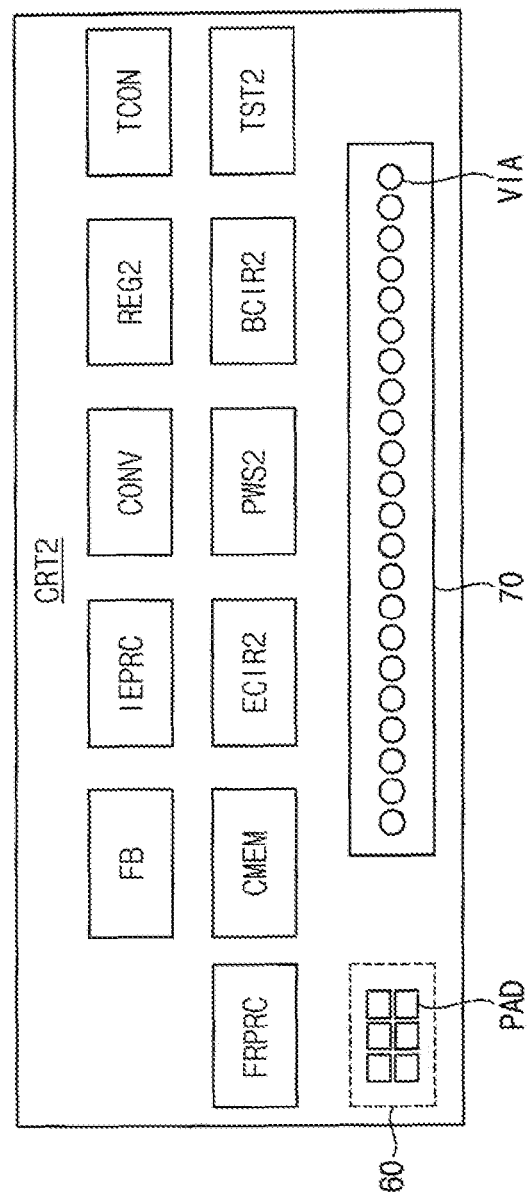

FIGS. 16A and 16B are diagrams illustrating example embodiments of a first circuit and a second circuit included in a stacked DDIC in the mobile device of FIG. 15. The descriptions repeated with FIGS. 3A and 3B may be omitted.

Referring to FIGS. 16A and 16B, the first circuit CRT1 included in the stacked DDIC of the mobile device 600 in FIG. 15 may further include a fingerprint recognition sensor FRSEN, and the second circuit CRT2 included in the stacked DDIC may further include a fingerprint processing circuit FRPRC.

The fingerprint recognition sensor FRSEN may detect an analog signal corresponding to a fingerprint of a user that is input through the fingerprint recognition window FRW of the display panel 100 in FIG. 15 and convert the analog signal to generate a digital signal corresponding to the fingerprint. The fingerprint processing circuit FRPRC may process the digital signal corresponding to the fingerprint to generate a control signal corresponding to a result of fingerprint recognition. The fingerprint recognition sensor FRSEN corresponds to an analog circuit and the fingerprint processing circuit FRPRC corresponds to a digital circuit.

As described with reference to FIGS. 13 through 16B, the analog circuits and the digital circuits associated with touch function, fingerprint recognition function, etc., may be included in the display module of the mobile device. The circuits may be disposed in the first circuit CRT1 and the second circuit CRT2 of the stacked DDIC according to an example embodiment, and the number and the manufacturing cost of the chips included in the display module may be reduced. Particularly, the circuits associated with the touch function and the fingerprint recognition function are interconnected very closely to the display function, and the performance of the display and sensors may be improved by combining the functions in the stacked DDIC according to an example embodiment.

Figure 17:
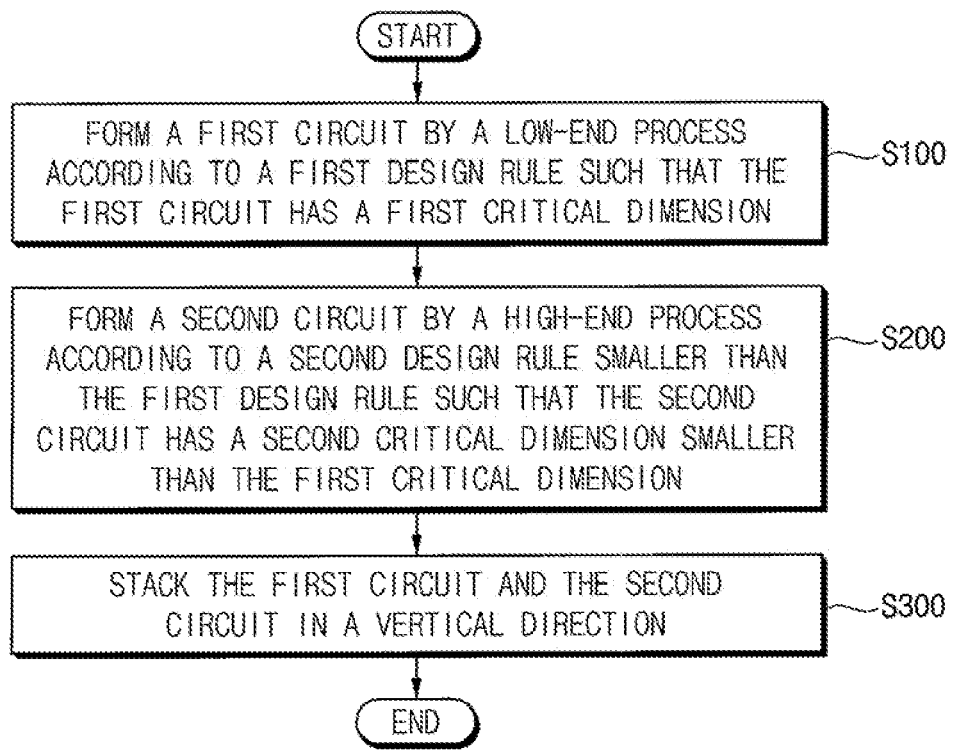
FIG. 17 is a flowchart illustrating a method of manufacturing a stacked DDIC according to an example embodiment.

FIG. 17 is a flowchart illustrating a method of manufacturing a stacked DDIC according to an example embodiment.

Referring to FIG. 17, a first circuit may be formed by a low-end process according to a first design rule such that the first circuit has a first critical dimension (S100). A second circuit may be formed by a high-end process according to a second design rule smaller than the first design rule such that the second circuit has a second critical dimension smaller than the first critical dimension (S200). The first circuit and the second circuit may be stacked in a vertical direction (S300). As described above, the first circuit may include analog circuits and the second circuit may include digital circuits.

Figure 18:
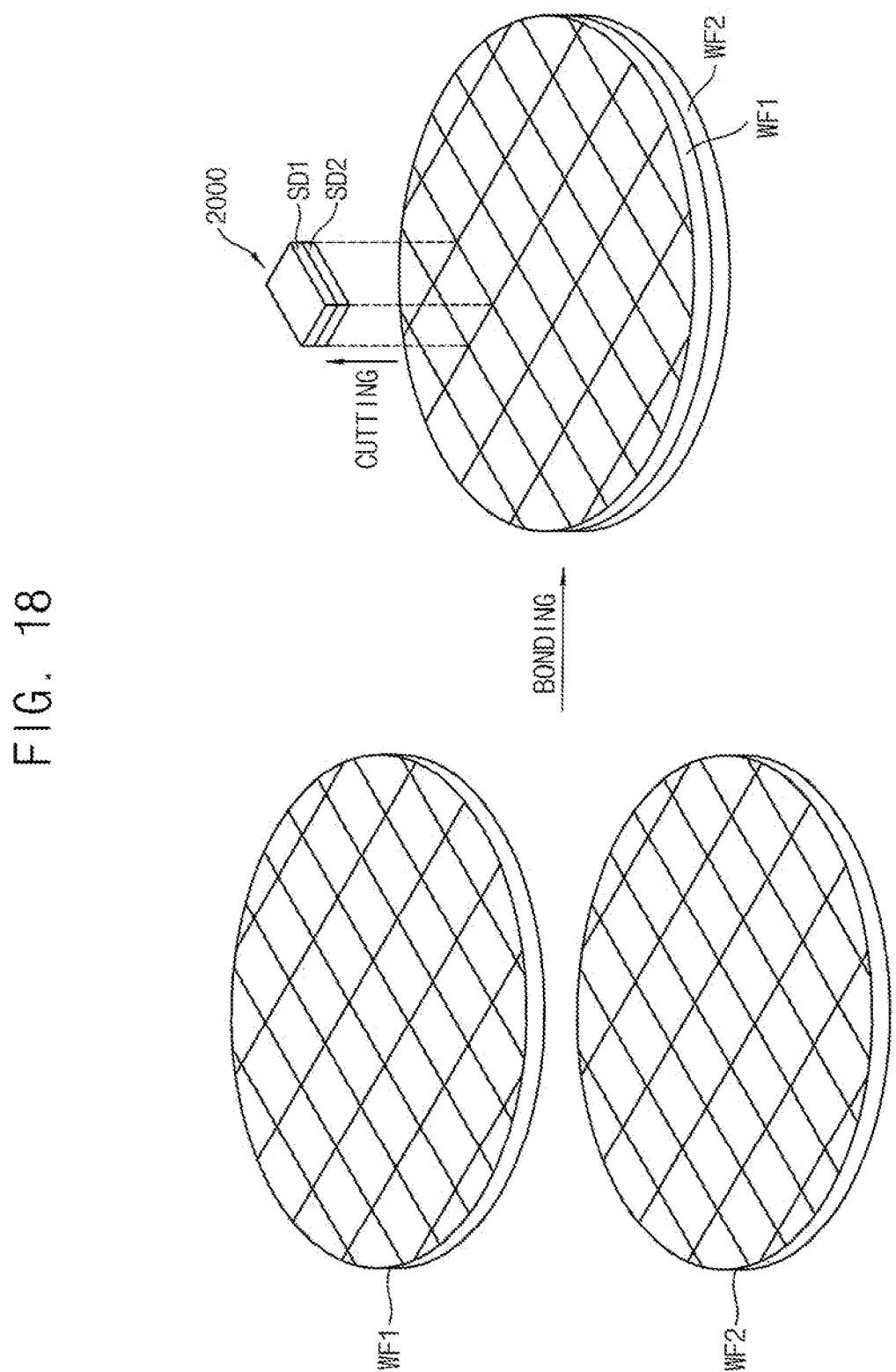
FIG. 18 is a conceptual diagram illustrating manufacturing processes of a stacked DDIC according to an example embodiment.

FIG. 18 is a conceptual diagram illustrating manufacturing processes of a stacked DDIC according to an example embodiment.

Referring to FIG. 18, respective integrated circuits may be formed on a first wafer WF1 and a second wafer WF2. The first circuit CRT1 as described above may be formed in the first wafer WF1 and the second circuit CRT2 as described above may be formed in the second wafer WF2.

FIG. 18 illustrates an example embodiment of a Wafer on Wafer (WoW) scheme, but example embodiments are not limited thereto. In an example embodiment, the stacked DDIC according to an example embodiment may be manufactured according to a Chip on Wafer (CoW) scheme. As only the chips that passed tests may be used before stacking the first circuit and the second circuit in case of the CoW scheme, yield of DDIC may be improved and manufacturing cost may be reduced. In addition, the two chips that are stacked may have different sizes and thus loss of the wafer for the chip of the smaller size may be reduced.

Figure 19:
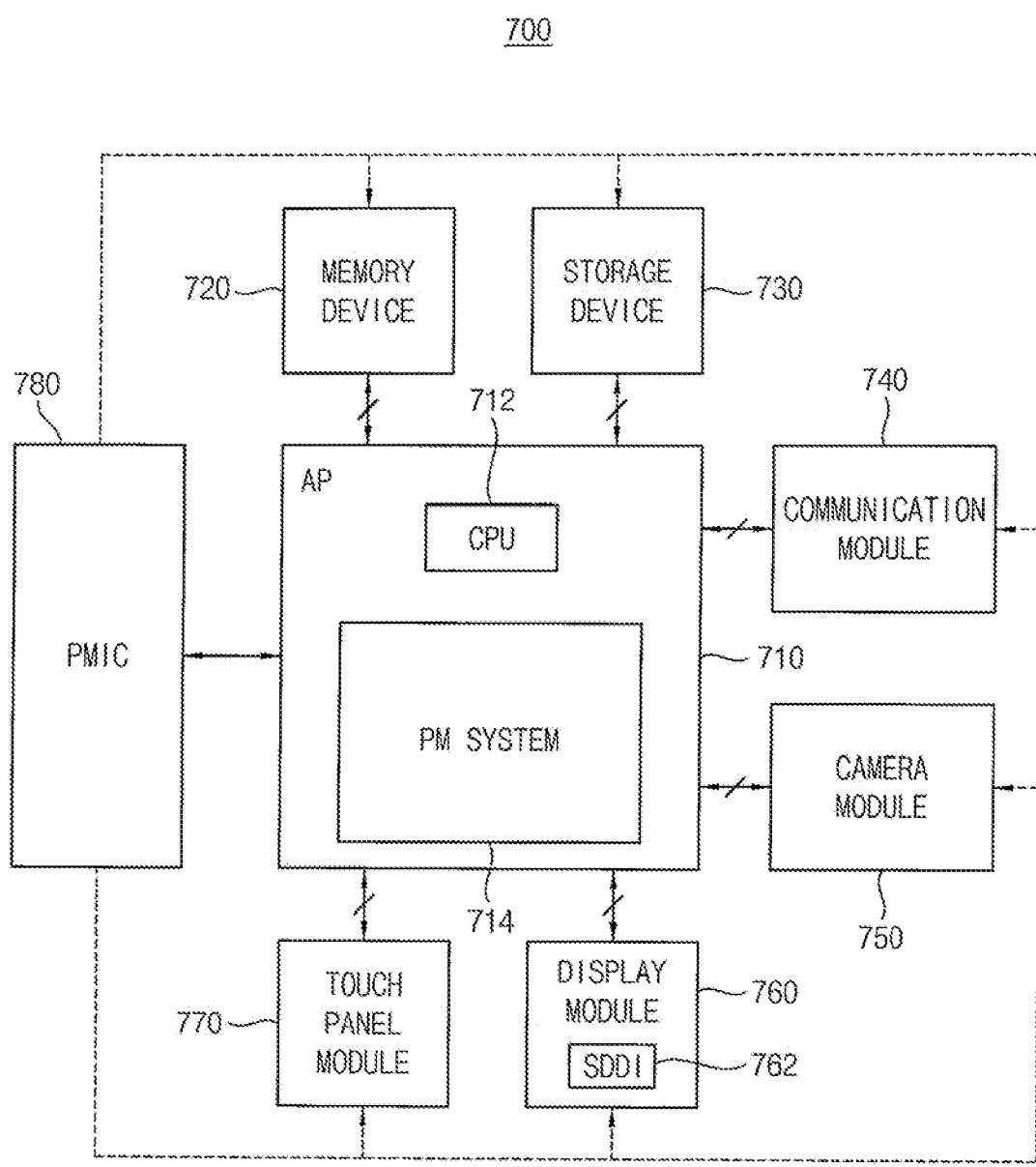
FIG. 19 is a block diagram illustrating a mobile device according to an example embodiment.

FIG. 19 is a block diagram illustrating a mobile device according to an example embodiment.

Referring to FIG. 19, a mobile device 700 may include a system on chip ("SoC") 710 as well as functional modules 740, 750, 760, and 770. The mobile device 700 may further include a memory device 720, a storage device 730, and a power management device 780.

The SoC 710 controls overall operations of the mobile device 700. In an example embodiment, the SoC 710 controls the memory device 720, the storage device 730, and the plurality of functional modules 740, 750, 760, and 770, for example. The SoC 710 may be an application processor ("AP") that is included in the mobile device 700.

The SoC 710 may include a CPU 712 and a power management system PM SYSTEM 714. The memory device 720 and the storage device 730 may store data for operations of the mobile device 700. In an example embodiment, the memory device 720 may include a volatile memory device, such as a dynamic random access memory ("DRAM"), a static random access memory ("SRAM"), a mobile DRAM, etc. In an example embodiment, the storage device 730 may include a nonvolatile memory device, such as an erasable programmable read-only memory ("EPROM"), an electrically EPROM ("EEPROM"), a flash memory, a phase change random access memory ("PRAM"), a resistance random access memory ("RRAM"), a nano floating gate memory ("NFGM"), a polymer random access memory ("PoRAM"), a magnetic random access memory ("MRAM"), a ferroelectric random access memory ("FRAM"), etc. In an example embodiment, the storage device 730 may further include a solid state drive ("SSD"), a hard disk drive ("HDD"), a CD-ROM, etc.

The functional modules 740, 750, 760, and 770 perform various functions of the mobile device 700. In an example embodiment, the mobile device 700 may include a communication module 740 that performs a communication function (e.g., a code division multiple access ("CDMA") module, a long term evolution ("LTE") module, a radio frequency (RF) module, an ultra-wideband ("UWB") module, a wireless local area network ("WLAN") module, a worldwide interoperability for a microwave access ("WIMAX") module, etc.), a camera module 750 that performs a camera function, a display module 760 that performs a display function, a touch panel module 770 that performs a touch sensing function, etc., for example. In an example embodiment, the mobile device 700 may further include a global positioning system ("GPS") module, a microphone ("MIC") module, a speaker module, a gyroscope module, etc., for example. However, the functional modules 740, 750, 760, and 770 in the mobile device 700 are not limited thereto.

The power management device 780 may provide an operating voltage to the SoC 710, the memory device 720, the storage device 730 and the functional modules 740, 750, 760, and 770.

According to an example embodiment, the display module 760 may include a stacked DDIC (SDDI) 762 including the first circuit CRT1 and the second circuit CRT2 that are stacked in the vertical direction as described above.

Figure 20:
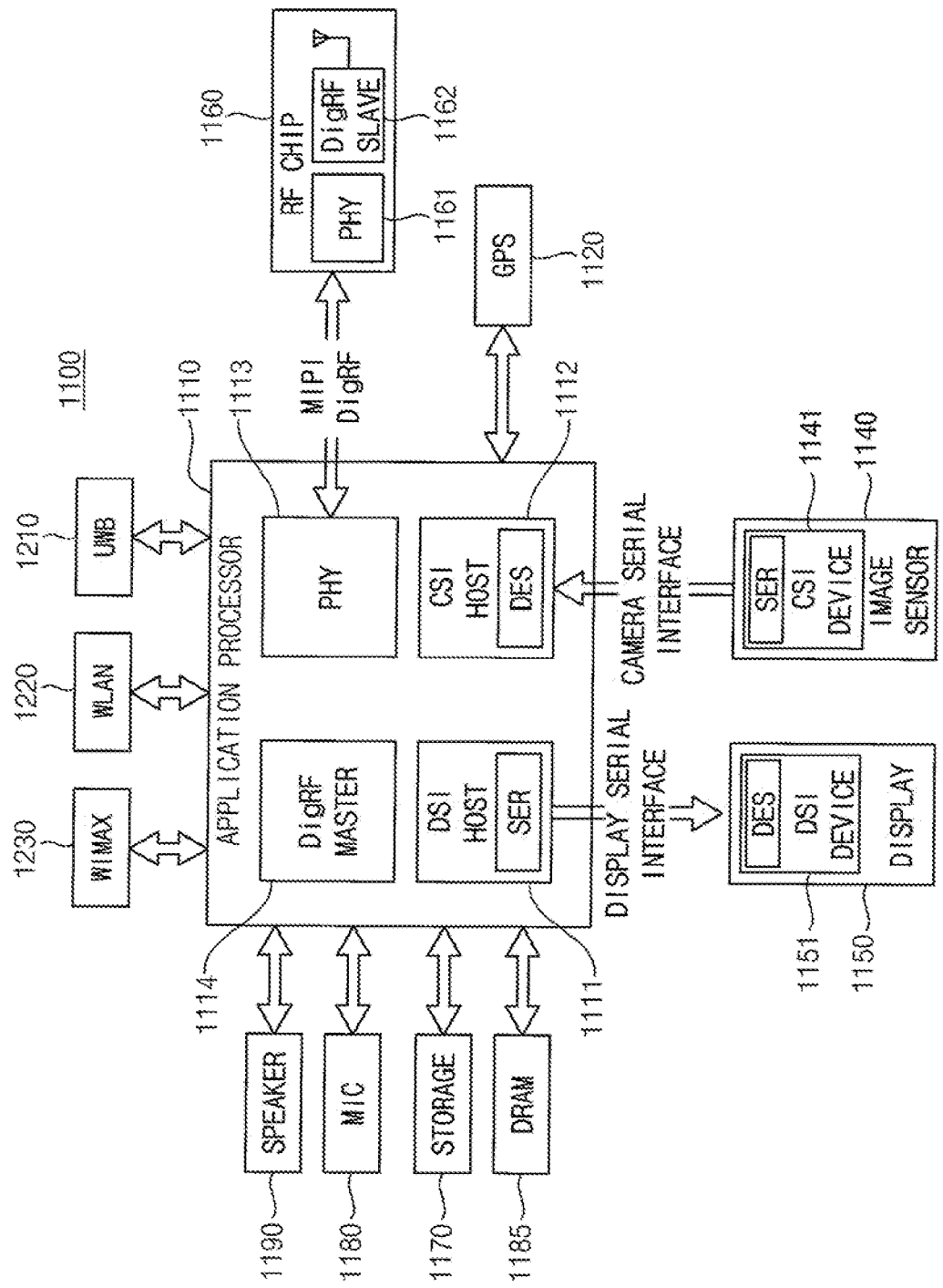
FIG. 20 is a block diagram illustrating a variety of interfaces that may be used in relation to the mobile device of FIG. 19.

FIG. 20 is a block diagram illustrating a variety of interfaces that may be used in relation to the mobile device of FIG. 19.

Referring to FIG. 20, a computing system 1100 may employ or support a MIPI interface, and may include an application processor 1110, a ToF sensor 1140, and a display device 1150. A CSI host 1112 of the application processor 1110 may perform a serial communication with a CSI device 1141 of the ToF sensor 1140 using a camera serial interface (CSI). In an example embodiment, the CSI host 1112 may include a deserializer DES, and the CSI device 1141 may include a serializer SER. A DSI host 1111 of the application processor 1110 may perform a serial communication with a DSI device 1151 of the display device 1150 using a display serial interface (DSI). In an example embodiment, the DSI host 1111 may include a serializer SER, and the DSI device 1151 may include a deserializer DES.

The computing system 1100 may further include a radio frequency (RF) chip 1160, which may include a physical layer PHY 1161 and a DigRF slave 1162. A physical layer PHY 1113 of the application processor 1110 may perform data transfer with the physical layer PHY 1161 of the RF chip 1160 using a MIPI DigRF. The PHY 1113 of the application processor 1110 may interface (or alternatively communicate) a DigRF MASTER 1114 for controlling the data transfer with the PHY 1161 of the RF chip 1160.

The computing system 1100 may further include a global positioning system (GPS) 1120, a storage device 1170, a microphone 1180, a DRAM 1185, and/or a speaker 1190. The computing system 1100 may communicate with external devices using an ultra-wideband (UWB) communication interface 1210, a wireless local area network (WLAN) communication interface 1220, a worldwide interoperability for microwave access (WIMAX) communication interface 1230, or the like. However, embodiments are not limited to only the configuration or interface(s) shown in FIG. 20.

According to an example embodiment, the display device 1150 may include a stacked DDIC including the first circuit CRT1 and the second circuit CRT2 that are stacked in the vertical direction as described above.

As described above, a size of a stacked DDIC according to an example embodiment may be reduced by stacking, in the vertical direction, a first circuit including analog circuits and a second circuit including digital circuits. In addition, the costs of designing and manufacturing the stacked DDIC according to an example embodiment may be reduced by forming the analog circuits and the digital circuits through distinct manufacturing processes, and performance of the stacked DDIC and the display device including the stacked DDIC may be enhanced. In addition, the stacked DDIC according to an example embodiment may reduce electromagnetic interference (EMI) and enhance performance by including the frame buffer and the compensation memory, to thus obviate a high-speed serial interface.

Example embodiments may be applied to a display device and any systems including the display device. For example, example embodiments may be applied to systems such as a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a vehicle navigation system, a video phone, a monitoring system, an auto focusing system, a tracking system, a motion detecting system, etc.

By way of summation and review, a size of a display driver integrated circuit (DDIC) may increase along with an increase in the resolution of the display panel. A DDIC in a mobile device such as a smartphone may include an embedded static random access memory (SRAM) as a frame buffer storing image data. A compensation memory may also be used to enhance the quality of a displayed image, and the size of the compensation memory may increase to address certain problems such as burn-in, hysteresis, etc. With increasing memory size, the size and cost of the DDIC may increase, i.e., given demands for expanded memory capacity upon various internal memory components. In addition, power consumption by the DDIC may increase as the result of increased resolution demands on image data, and additional data processing requirements, etc.

As described above, example embodiments may provide a stacked display driver integrated circuit (DDIC) capable of efficiently driving a display panel, a denoising device including the stacked DDIC, and a method of manufacturing the stacked DDIC. The size of a stacked DDIC according to an example embodiment may be reduced by stacking, in the vertical direction, the first circuit including analog circuits and the second circuit including digital circuits. The costs of designing and manufacturing a stacked DDIC according to an embodiment may be reduced by forming the analog circuits and the digital circuits through distinct manufacturing processes, and performance of the stacked DDIC and the display device including the stacked DDIC may be enhanced. A stacked DDIC according to an example embodiment may reduce electromagnetic interference (EMI) and enhance performance by including the frame buffer and the compensation memory, to thus obviate a high-speed serial interface.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A stacked display driver integrated circuit (DDIC) configured to drive a display panel of a display device, the stacked DDIC comprising:
   a first circuit formed by a low-end process according to a first design rule such that the first circuit has a first critical dimension;
   a host connection pad configured to electrically connect to a host device, the host connection pad disposed at an upper surface of the stacked DDIC and electrically connected to the first circuit by a first conductive via;
   a panel connection pad configured to electrically connect to a display panel, the panel connection pad disposed at the upper surface of the stacked DDIC and electrically connected to the first circuit by a second conductive via; and
   a second circuit formed by a high-end process according to a second design rule smaller than the first design rule such that the second circuit has a second critical dimension smaller than the first critical dimension, wherein the first circuit and the second circuit are stacked in a vertical direction.

2. The stacked DDIC as claimed in claim 1, wherein:
   the first circuit includes analog circuits configured to process analog signals, and
   the second circuit includes digital circuits configured to process digital signals, and a memory configured to store data.

3. The stacked DDIC as claimed in claim 2, wherein the memory includes:
   a frame buffer configured to store image data by units of frame; and
   a compensation memory configured to store data generated during processing of the image data.

4. The stacked DDIC as claimed in claim 2, wherein:
   the analog circuits include:
      a source driver configured to apply data signals to the display panel through data lines; and
      a gate driver configured to apply scan signals to the display panel through scan lines, and
   the digital circuits include;
      a timing controller configured to control operations of the stacked DDIC;
      an image enhancement processing circuit configured to process image data, to generate processed data; and
      a panel compensation circuit configured to convert the processed data, to generate display data driving the display panel.

5. The stacked DDIC as claimed in claim 4, wherein the second circuit further includes a host interface configured to receive the image data from a host device.

6. The stacked DDIC as claimed in claim 4, wherein:
   the analog circuits further include a touch sensor configured to detect an analog signal corresponding to a touch operation of a user and provided from a touch panel, and convert the analog signal to generate a digital signal corresponding to the touch operation, and
   the digital circuits further include a touch processing circuit configured to process the digital signal corresponding to the touch operation to generate a control signal corresponding to the touch operation.

7. The stacked DDIC as claimed in claim 4, wherein:
   the analog circuits further include a fingerprint recognition sensor configured to detect an analog signal corresponding to a fingerprint of a user that is input through a fingerprint recognition window of the display panel, and convert the analog signal to generate a digital signal corresponding to the fingerprint, and
   the digital circuits further include a fingerprint processing circuit configured to process the digital signal corresponding to the fingerprint to generate a control signal corresponding to a result of fingerprint recognition.

8. The stacked DDIC as claimed in claim 1, further comprising:
   a first semiconductor chip including a first semiconductor substrate and a first passivation layer such that the first circuit is formed on an upper surface of the first semiconductor substrate and the first passivation layer covers the first circuit and the upper surface of the first semiconductor substrate; and
   a second semiconductor chip including a second semiconductor substrate and a second passivation layer such that the second circuit is formed on an upper surface of the second semiconductor substrate and the second passivation layer covers the second circuit and the upper surface of the second semiconductor substrate.

9. The stacked DDIC as claimed in claim 8, wherein the stacked DDIC has a face-to-back stack structure such that a bottom surface of the first semiconductor chip is opposite to an upper surface of the second semiconductor chip.

10. The stacked DDIC as claimed in claim 9, further comprising:
first bonding pads disposed on the bottom surface of the first semiconductor chip;
through-silicon vias passing through the first semiconductor substrate and electrically connecting the first bonding pads and the first circuit;
second bonding pads disposed on the upper surface of the second semiconductor chip and electrically connected to the first bonding pads; and
vias disposed in the second passivation layer and electrically connecting the second bonding pads and the second circuit.

11. The stacked DDIC as claimed in claim 9, wherein:
the first conductive via is disposed in the first passivation layer; and
the second conductive via is disposed in the first passivation layer.

12. The stacked DDIC as claimed in claim 8, wherein the stacked DDIC has a face-to-face stack structure such that an upper surface of the first semiconductor chip is opposite to an upper surface of the second semiconductor chip.

13. The stacked DDIC as claimed in claim 12, further comprising:
first bonding pads disposed on the upper surface of the first semiconductor chip;
first vias disposed in the first passivation layer and electrically connecting the first bonding pads and the first circuit;
second bonding pads disposed on the upper surface of the second semiconductor chip and electrically connected to the first bonding pads; and
second vias disposed in the second passivation layer and electrically connecting the second bonding pads and the second circuit.

14. The stacked DDIC as claimed in claim 12, wherein:
the first conductive via passes through the first semiconductor substrate; and
the second conductive via passes through the first semiconductor substrate.

15. The stacked DDIC as claimed in claim 1, wherein the stacked DDIC has a monolithic stack structure such that the first circuit and the second circuit are stacked in the vertical direction on a single semiconductor substrate.

16. A display device, comprising:
a display panel including a plurality of pixels; and
a stacked display driver integrated circuit (DDIC) configured to drive the display panel, the stacked DDIC including:
a first circuit formed by a low-end process according to a first design rule such that the first circuit has a first critical dimension;
a host connection pad configured to electrically connect to a host device, the host connection pad disposed at an upper surface of the stacked DDIC and electrically connected to the first circuit by a first conductive via;
a panel connection pad configured to electrically connect to the display panel, the panel connection pad disposed at the upper surface of the stacked DDIC and electrically connected to the first circuit by a second conductive via; and
a second circuit formed by a high-end process according to a second design rule smaller than the first design rule such that the second circuit has a second critical dimension smaller than the first critical dimension, wherein the first circuit and the second circuit are stacked in a vertical direction in the stacked DDIC.

17. The display device as claimed in claim 16, wherein:
the first circuit includes analog circuits configured to process analog signals, and
the second circuit includes digital circuits configured to process digital signals, and a memory configured to store data.

18. The display device as claimed in claim 16, further comprising:
a first semiconductor chip including a first semiconductor substrate and a first passivation layer such that the first circuit is formed on an upper surface of the first semiconductor substrate and the first passivation layer covers the first circuit and the upper surface of the first semiconductor substrate; and
a second semiconductor chip including a second semiconductor substrate and a second passivation layer such that the second circuit is formed on an upper surface of the second semiconductor substrate and the second passivation layer covers the second circuit and the upper surface of the second semiconductor substrate, wherein the stacked DDIC has a face-to-back stack structure such that a bottom surface of the first semiconductor chip is opposite to an upper surface of the second semiconductor chip or the stacked DDIC has a face-to-face stack structure such that an upper surface of the first semiconductor chip is opposite to the upper surface of the second semiconductor chip.

19. The display device as claimed in claim 16, wherein the stacked DDIC has a monolithic stack structure such that the first circuit and the second circuit are stacked in the vertical direction on a single semiconductor substrate.

20. A method of manufacturing a stacked display driver integrated circuit (DDIC), comprising:
forming a first circuit by a low-end process according to a first design rule such that the first circuit has a first critical dimension;
forming a second circuit by a high-end process according to a second design rule smaller than the first design rule such that the second circuit has a second critical dimension smaller than the first critical dimension;
forming a first conductive via electrically connected to the first circuit;
forming a host connection pad configured to electrically connect to a host device, the host connection pad disposed at an upper surface of the stacked DDIC and electrically connected to the first circuit by a first conductive via;
forming a second conductive via electrically connected to the first circuit;
forming a panel connection pad configured to electrically connect to a display panel, the panel connection pad disposed at the upper surface of the stacked DDIC and electrically connected to the first circuit by a second conductive via; and
stacking the first circuit and the second circuit in a vertical direction.

* * * * *